United States Patent
An et al.

(10) Patent No.: US 12,520,429 B2
(45) Date of Patent: Jan. 6, 2026

(54) FUNCTIONAL SUBSTRATE AND METHOD FOR MANUFACTURING THE SAME, AND ELECTRONIC DEVICE

(71) Applicants: Beijing BOE Optoelectronics Technology Co., Ltd., Beijing (CN); BOE Technology Group Co., Ltd., Beijing (CN)

(72) Inventors: Qichang An, Beijing (CN); Yifan Wu, Beijing (CN); Yuelei Xiao, Beijing (CN); Yue Li, Beijing (CN); Yulin Feng, Beijing (CN); Huiying Li, Beijing (CN); Biqi Li, Beijing (CN)

(73) Assignees: Beijing BOE Optoelectronics Technology Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 211 days.

(21) Appl. No.: 18/276,636

(22) PCT Filed: Jul. 27, 2022

(86) PCT No.: PCT/CN2022/108091
§ 371 (c)(1),
(2) Date: Aug. 9, 2023

(87) PCT Pub. No.: WO2024/020819
PCT Pub. Date: Feb. 1, 2024

(65) Prior Publication Data
US 2025/0008662 A1    Jan. 2, 2025

(51) Int. Cl.
*H05K 1/18* (2006.01)
(52) U.S. Cl.
CPC ... *H05K 1/182* (2013.01); *H05K 2201/10015* (2013.01); *H05K 2201/1003* (2013.01)

(58) Field of Classification Search
CPC .. H05K 1/11; H05K 1/112–117; H05K 1/184; H05K 3/0035; H05K 3/0038;
(Continued)

(56) References Cited

U.S. PATENT DOCUMENTS

| | | | | |
|---|---|---|---|---|
| 6,239,386 B1 * | 5/2001 | DiStefano | ............. | H05K 3/462 |
| | | | | 174/265 |
| 7,786,390 B2 * | 8/2010 | Ikeda | .................... | H05K 3/427 |
| | | | | 174/255 |

(Continued)

FOREIGN PATENT DOCUMENTS

| | | |
|---|---|---|
| CN | 1748299 A | 3/2006 |
| CN | 112119499 A | 12/2020 |

(Continued)

OTHER PUBLICATIONS

Chen et al., "Development of Through Glass Via Technology," Electronics & Packaging, Apr. 2021, vol. 21 No. 4, 13 pages, English Abstract.

*Primary Examiner* — Tuan T Dinh
(74) *Attorney, Agent, or Firm* — HOUTTEMAN LAW LLC

(57) ABSTRACT

A functional substrate includes a first dielectric substrate, which includes a first surface and a second surface oppositely arranged along a thickness direction of the first dielectric substrate; the first dielectric substrate is provided with a first connection hole at least penetrating through the first surface; a first connection electrode is arranged in the first connection hole, which includes a first sub-hole and a second sub-hole sequentially arranged along a direction away from the second surface and communicated with each other; the second sub-hole penetrates through the first surface; an opening width of the second sub-hole is monotonically increased in the direction away from the second surface, and a minimum opening width of the second (Continued)

sub-hole is not smaller than a maximum opening width of the first sub-hole; the first and second sub-holes form a corner at a position where the first sub-hole and the second sub-hole are connected.

15 Claims, 17 Drawing Sheets

(58) Field of Classification Search
CPC .. H05K 3/0041; H05K 3/0044; H05K 3/0047; H05K 3/005
USPC ................ 361/767–775, 792–795, 760–784; 174/258–264
See application file for complete search history.

(56) References Cited

U.S. PATENT DOCUMENTS

| | | | |
|---|---|---|---|
| 8,907,227 B2* | 12/2014 | Wang | H10D 88/101 361/764 |
| 9,049,808 B2* | 6/2015 | Takada | H01L 23/49822 |
| 9,814,131 B2* | 11/2017 | Uemichi | H04L 25/0272 |
| 10,424,606 B1 | 9/2019 | Garner et al. | |
| 2008/0054486 A1 | 3/2008 | Murayama et al. | |
| 2009/0225525 A1* | 9/2009 | Mano | H01F 17/0006 361/760 |
| 2011/0048775 A1* | 3/2011 | Ishida | H05K 1/115 29/829 |
| 2014/0204548 A1* | 7/2014 | Sekine | H10D 1/20 361/761 |
| 2018/0029924 A1 | 2/2018 | Inoue et al. | |
| 2023/0240009 A1* | 7/2023 | Takada | H05K 1/09 |

FOREIGN PATENT DOCUMENTS

| | | |
|---|---|---|
| CN | 112864026 A | 5/2021 |
| CN | 113045209 A | 6/2021 |
| CN | 114070220 A | 2/2022 |
| CN | 114520222 A | 5/2022 |
| JP | H 0878525 A | 3/1996 |
| JP | H 08186111 A | 7/1996 |

* cited by examiner

FUNCTIONAL SUBSTRATE AND METHOD FOR MANUFACTURING THE SAME, AND ELECTRONIC DEVICE

TECHNICAL FIELD

The present disclosure relates to the field of electronic component technology, and particularly relates to a functional substrate, a method for manufacturing the functional substrate and an electronic device.

BACKGROUND

In contemporary times, the consumer electronics industry is developing day by day, mobile communication terminals represented by mobile phones, particularly 5G mobile phones, are developing rapidly, frequency bands of signals to be processed by the mobile phones are increasing, the number of radio frequency chips required is accordingly rising, and the form of mobile phones favored by the consumers is constantly evolving towards a trend of miniaturization, lightness, and long battery life. In a traditional mobile phone, a large number of discrete devices such as resistors, capacitors, inductors, filters and the like exist on a radio frequency printed circuit board (PCB), and the discrete devices have defects of large volume, high power consumption, multiple welding spots and large variation in parasitic parameter, and are difficult to meet future requirements. Interconnection, matching and the like between the radio frequency chips require integrated passive devices with small area, high performance and good consistency. The current integrated passive devices on the market are mainly based on Si (silicon) substrates and GaAs (gallium arsenide) substrates. The Si-based integrated passive device has an advantage of being cheap, but has high microwave loss due to the fact that Si contains trace impurities (poor insulation), and thus has an average performance. The GaAs-based integrated passive devices have an advantage of excellent performance, but are expensive.

SUMMARY

The present disclosure is directed to solve at least one of the technical problems in the related art, and provides a functional substrate, a method for manufacturing the functional substrate and an electronic device.

In a first aspect, an embodiment of the present disclosure provides a functional substrate, which includes a first dielectric substrate, the first dielectric substrate includes a first surface and a second surface which are oppositely arranged along a thickness direction of the first dielectric substrate; the first dielectric substrate is provided with a first connection hole; the first connection hole at least penetrates through the first surface; a first connection electrode is arranged in the first connection hole;

the first connection hole includes a first sub-hole and a second sub-hole which are sequentially arranged along a direction away from the second surface and are communicated with each other; the second sub-hole penetrates through the first surface;

an opening width of the second sub-hole is monotonically increased in the direction away from the second surface, and a minimum opening width of the second sub-hole is not smaller than a maximum opening width of the first sub-hole; the first sub-hole and the second sub-hole form a corner at a position where the first sub-hole and the second sub-hole are connected with each other.

In some implementations, the first connection hole penetrates through the first surface and the second surface, the first connection hole further includes a third sub-hole communicating with the first sub-hole and penetrating through the second surface; an opening width of the third sub-hole is monotonically decreased in the direction away from the second surface, and a minimum opening width of the third sub-hole is not smaller than the maximum opening width of the first sub-hole; and the first sub-hole and the third sub-hole form a corner at a position where the first sub-hole and the third sub-hole are connected with each other.

In some implementations, the first sub-hole penetrates through the second surface.

In some implementations, the first sub-hole has an hourglass shape.

In some implementations, an opening width of the first sub-hole is monotonically increased in the direction away from the second surface.

In some implementations, the first connection electrode fills the first connection hole or covers only an inner wall of the first connection hole.

In some implementations, the functional substrate further includes a first conductive layer located on the first surface and connected with the first connection electrode.

In some implementations, the first connection hole penetrates through the second surface, and the functional substrate further includes a second conductive layer located on the second surface, and the second conductive layer is connected with the first connection electrode.

In some implementations, the functional substrate further includes an inductor integrated on the first dielectric substrate, the inductor includes a first sub-structure, a second sub-structure, and a plurality of the first connection electrodes; the first sub-structure is located on the first surface, the second sub-structure is located on the second surface, and the first sub-structure is connected with the second sub-structure through the first connection electrode to form a coil structure of the inductor.

In some implementations, the functional substrate further includes a first plate of a capacitor located in the first conductive layer; a first interlayer dielectric layer located on a side of the first conductive layer away from the first dielectric substrate; and a second plate of the capacitor located on a side of the first interlayer dielectric layer away from the first conductive layer.

In some implementations, the functional substrate further includes a second interlayer dielectric layer, a second connection electrode, and a third connection electrode located on a side of the second plate of the capacitor away from the first dielectric substrate;

the second connection electrode is connected with a lead end of the inductor through a second connection hole penetrating through the first interlayer dielectric layer and the second interlayer dielectric layer; the third connection electrode is electrically connected with the second plate of the capacitor through a third connection hole penetrating through the second interlayer dielectric layer.

In some implementations, the functional substrate further includes a first protective layer and a first planarization layer sequentially located on a side of a layer, in which the second connection electrode and the third connection electrode are located, away from the first dielectric substrate, and a first connection pad and a second connection pad;

the first connection pad is connected with the second connection electrode through a fourth connection hole, and the second connection pad is connected with the third connection electrode through a fifth connection hole; both the fourth connection hole and the fifth connection hole penetrate through the first protective layer and the first planarization layer.

In some implementations, the functional substrate further includes a second protective layer and a second planarization layer sequentially located on a side of the second conductive layer away from the first dielectric substrate.

In some implementations, the first connection hole penetrates through the second surface, the functional substrate further includes: a first conductive layer located on the first surface and a second conductive layer located on the second surface, the first conductive layer and the second conductive layer being connected through the first connection hole; a first buffer layer located between the first conductive layer and the first surface; and a second buffer layer located between the second conductive layer and the second surface.

An embodiment of the present disclosure provides a method for manufacturing a functional substrate, including:

providing a first dielectric substrate, the first dielectric substrate including a first surface and a second surface which are oppositely arranged along a thickness direction of the first dielectric substrate;

forming a first connection hole in the first dielectric substrate, the first connection hole at least penetrating through the first surface; the first connection hole including a first sub-hole and a second sub-hole which are sequentially arranged along a direction away from the second surface and are communicated with each other; the second sub-hole penetrating through the first surface; an opening width of the second sub-hole being monotonically increased in the direction away from the second surface, and a minimum opening width of the second sub-hole being not smaller than a maximum opening width of the first sub-hole; the first sub-hole and the second sub-hole forming a corner at a position where the first sub-hole and the second sub-hole are connected with each other; and forming a first connection electrode located in the first connection hole.

In some implementations, the forming the first connection hole includes:

providing the first dielectric substrate, and forming a photoresist layer on the first surface of the first dielectric substrate;

exposing, developing and etching the photoresist layer to form a fully exposed region corresponding to the first connection hole and an unexposed region; and irradiating, by a laser, a position of the first dielectric substrate corresponding to the fully exposed region, and removing a material of the first dielectric substrate at the position corresponding to the fully exposed region to form the first connection hole.

In some implementations, the first connection hole penetrates through the second surface.

In some implementations, the forming the first connection hole includes: providing the first dielectric substrate, forming a first photoresist layer on the first surface of the first dielectric substrate, and forming a second photoresist layer on the second surface; exposing, developing and etching the first photoresist layer to form a first fully exposed region corresponding to the first connection hole and a first unexposed region; exposing, developing and etching the second photoresist layer to form a second fully exposed region corresponding to the first connection hole and a second unexposed region;

respectively irradiating, by a laser, positions of the first dielectric substrate corresponding to the first fully exposed region and the second fully exposed region, and removing a material of the first dielectric substrate at the positions corresponding to the first fully exposed region and the second fully exposed region to form the first connection hole, the first connection hole penetrating through the second surface.

In some implementations, the method further includes: forming a first conductive layer on the first surface, the first conductive layer being connected with the first connection electrode.

In some implementations, the method further includes: forming a second conductive layer on the second surface, the second conductive layer being connected with the first connection electrode.

In some implementations, the method further includes: forming an inductor on the first dielectric substrate, the inductor including a first sub-structure, a second sub-structure and a plurality of the first connection electrodes, the first sub-structure being located on the first surface, the second sub-structure being located on the second surface, and the first sub-structure being connected with the second sub-structure through the first connection electrode to form a coil structure of the inductor.

In a second aspect, an embodiment of the present disclosure provides an electronic device, which includes the functional substrate described above.

DETAIL DESCRIPTION OF EMBODIMENTS

Figure 1:
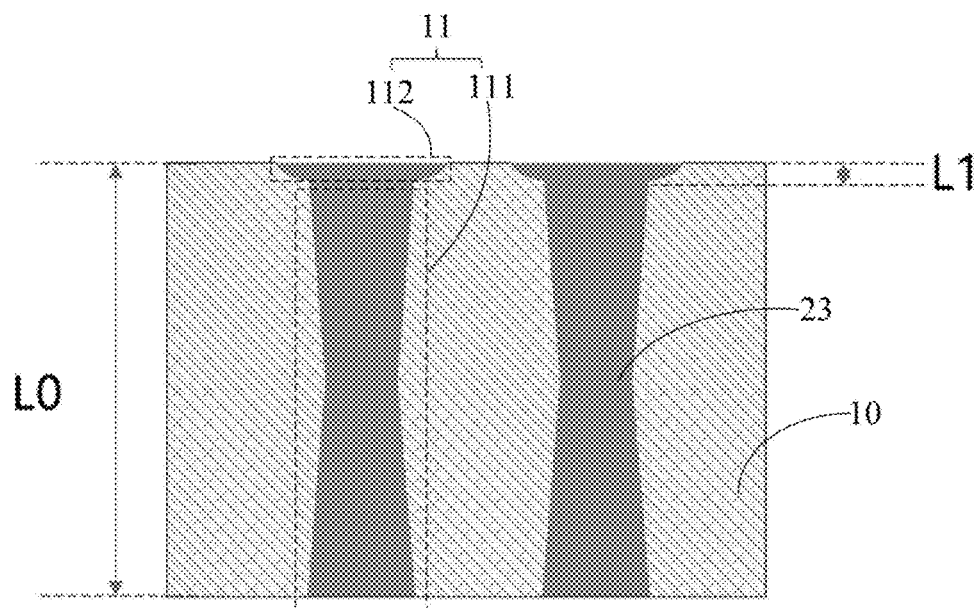
FIG. 1 is a schematic diagram of a functional substrate in a first example of an embodiment of the present disclosure.

In order to make the technical solutions of the present invention better understood, the present disclosure is further described in detail with reference to the accompanying drawings and implementations below.

Unless defined otherwise, technical or scientific terms used herein shall have the ordinary meaning as understood by one of ordinary skill in the art to which the present disclosure belongs. The use of "first," "second," and the like in the present disclosure is not intended to indicate any order, quantity, or importance, but rather is used to distinguish one element from another. Also, the use of the terms "a," "an," or "the" and similar referents does not denote a limitation of quantity, but rather denotes the presence of at least one. The word "includes/including" or "includes/including", and the like, means that the element or item preceding the word includes the element or item listed after the word and its equivalent, but does not exclude other elements or items. The terms "connected/connecting" or "coupled/coupling" and the like are not restricted to physical or mechanical connections, but may include electrical connections, whether direct or indirect. Terms "Upper/on", "lower/under", "left", "right", and the like are used only to indicate relative positional relationships, and when the absolute position of the object being described is changed, the relative positional relationships may be changed accordingly.

In a first aspect, an embodiment of the present disclosure provides a functional substrate that includes a first dielectric substrate including a first surface and a second surface oppositely disposed along a thickness direction of the first dielectric substrate. The first dielectric substrate has a first connection hole. The first connection hole penetrates through at least the first surface, that is, the first connection hole may be a through hole or a blind hole. The functional substrate further includes a first connection electrode disposed in the first connection hole.

In the embodiment of the present disclosure, the first connection hole includes a first sub-hole and a second sub-hole which are sequentially arranged in a direction away from the second surface and are communicated with each other; the second sub-hole penetrates through the first surface; an opening width of the second sub-hole is monotonically increased in a direction away from the second surface, and a minimum opening width of the second sub-hole is not smaller than a maximum opening width of the first sub-hole; the first sub-hole and the second sub-hole form a corner at a position where the first sub-hole and the second sub-hole are connected. It can be understood that a size of an opening, formed by the second sub-hole of the first connection hole, penetrating through the first surface is relatively large, so that an influence of thermal stress during forming a conductive structure, connected with the first connection electrode, on the first surface can be effectively reduced, thereby reducing the occurrence of undesirable disconnection and the like.

The structure of the functional substrate and a method for manufacturing the functional substrate according to embodiments of the present disclosure are described below with reference to specific examples.

First Example

FIG. 1 is a schematic diagram of a functional substrate in a first example of an embodiment of the present disclosure; as shown in FIG. 1, in the functional substrate, a first connection hole 11 penetrates through a first dielectric substrate 10, and the first connection hole 11 includes only a first sub-hole 111 and a second sub-hole 112. The second sub-hole 112 penetrates through the first surface; the second sub-hole 112 has an opening width monotonically increased in a direction away from the second surface, and a minimum opening width of the second sub-hole 112 is not smaller than a maximum opening width of the first sub-hole 111; and the first sub-hole 111 and the second sub-hole 112 form a corner at a position where the first sub-hole 111 and the second sub-hole 112 are connected.

Figure 4:
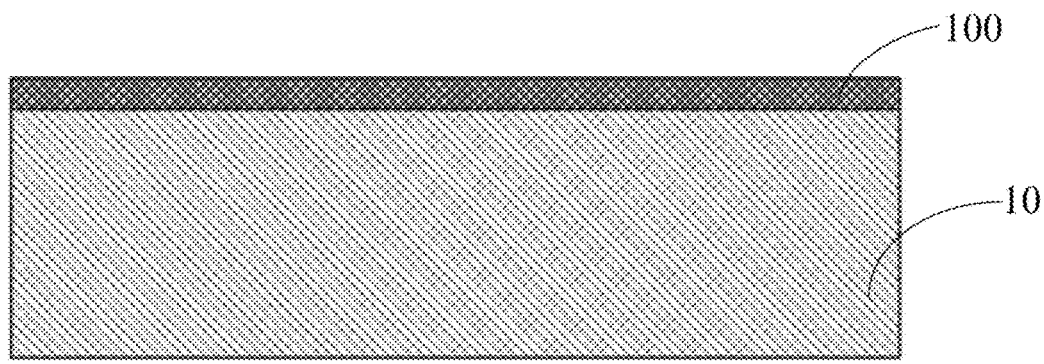
FIG. 4 is a schematic diagram of an intermediate product formed in a step S11 of a method for manufacturing the functional substrate in the first example of the embodiment of the present disclosure.
Figure 5:
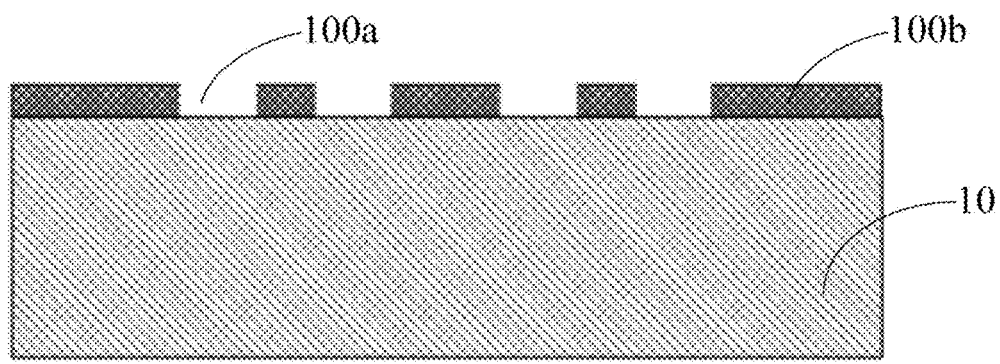
FIG. 5 is a schematic diagram of an intermediate product formed in a step S12 of the method for manufacturing the functional substrate in the first example of the embodiment of the present disclosure.
Figure 6:
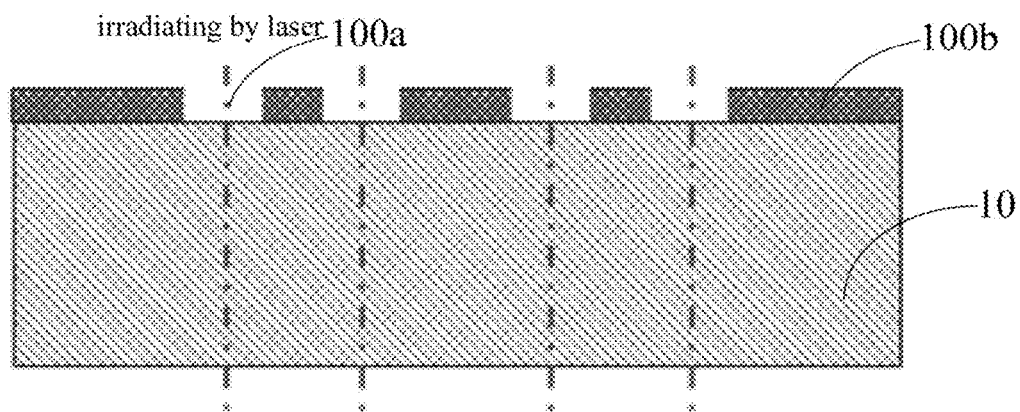
FIG. 6 is a schematic diagram of an intermediate product formed in a step S13 of the method for manufacturing the functional substrate in the first example of the embodiment of the present disclosure.
Figure 7:
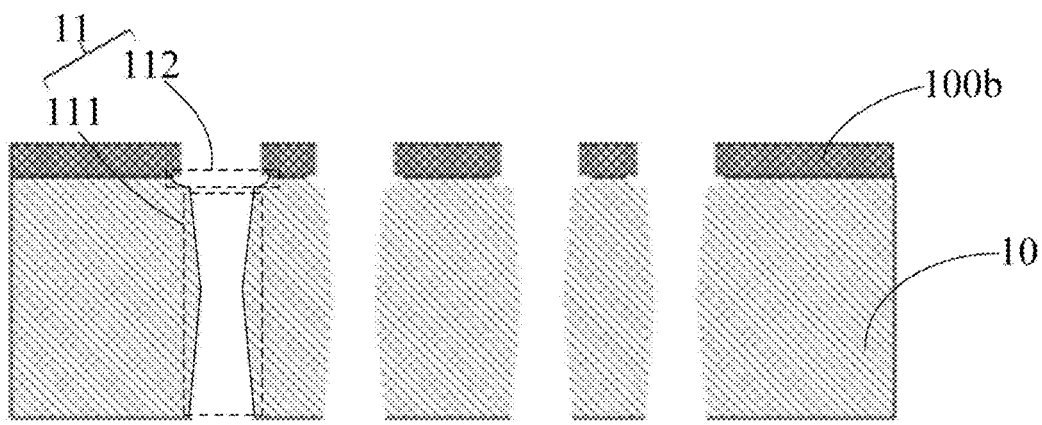
FIG. 7 is a schematic diagram of an intermediate product formed in a step S14 of the method for manufacturing the functional substrate in the first example of the embodiment of the present disclosure.
Figure 8:
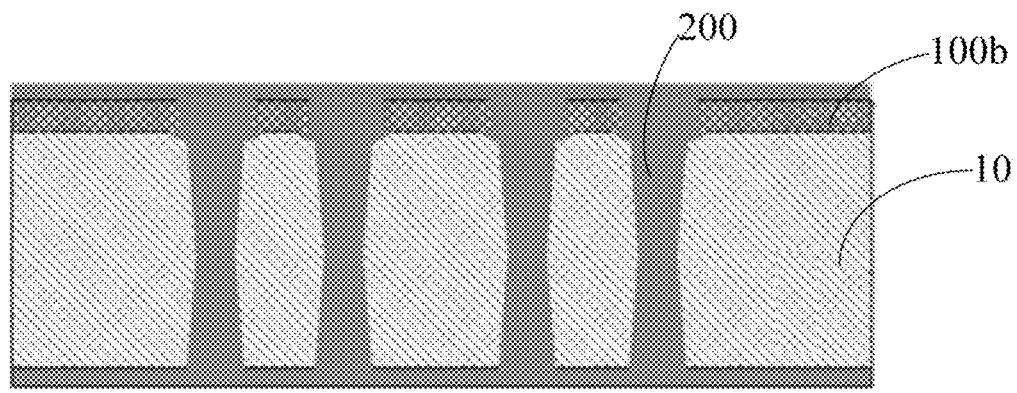
FIG. 8 is a schematic diagram of an intermediate product formed in a step S15 of the method for manufacturing the functional substrate in the first example of the embodiment of the present disclosure.
Figure 9:
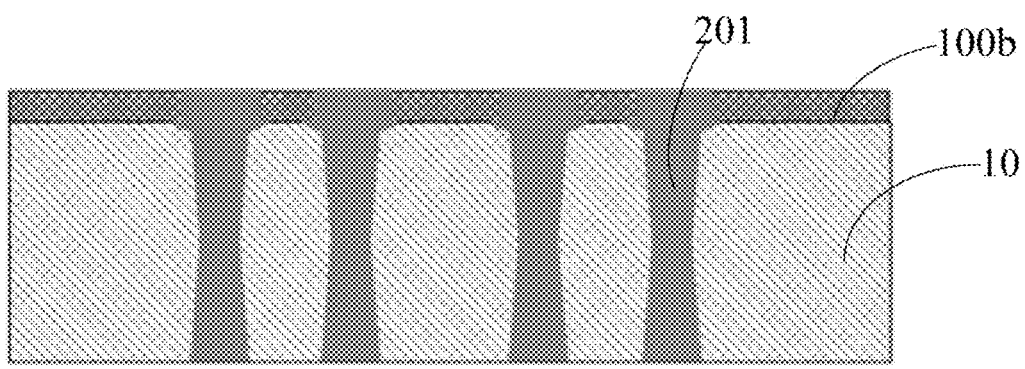
FIG. 9 is a schematic diagram of an intermediate product formed in a step S16 of the method for manufacturing the functional substrate in the first example of the embodiment of the present disclosure.
Figure 10:
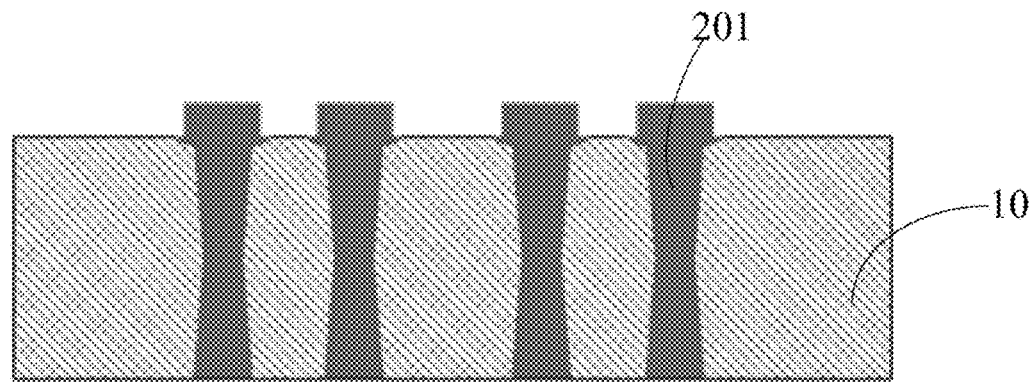
FIG. 10 is a schematic diagram of an intermediate product formed in a step S17 of the method for manufacturing the functional substrate in the first example of the embodiment of the present disclosure.
Figure 11:
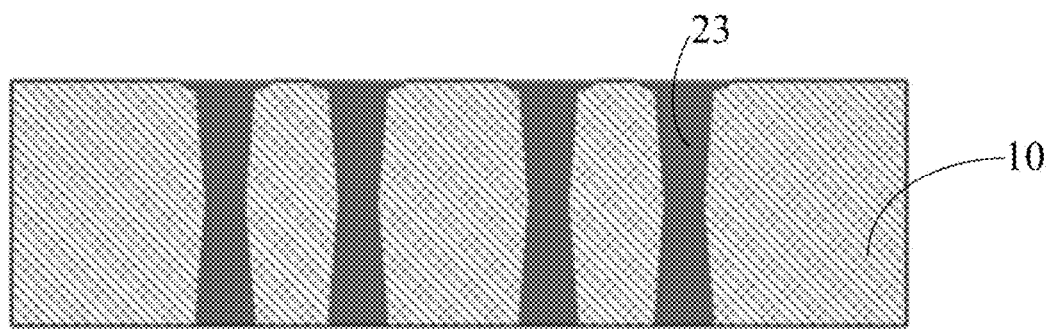
FIG. 11 is a schematic diagram of an intermediate product formed in a step S18 of the method for manufacturing the functional substrate in the first example of the embodiment of the present disclosure.

For the functional substrate, an embodiment of the present disclosure provides a method for manufacturing the functional substrate. FIG. 4 is a schematic diagram of an intermediate product formed in a step S11 of a method for manufacturing the functional substrate in the first example of the embodiment of the present disclosure; FIG. 5 is a schematic diagram of an intermediate product formed in a step S12 of the method for manufacturing the functional substrate in the first example of the embodiment of the present disclosure; FIG. 6 is a schematic diagram of an intermediate product formed in a step S13 of the method for manufacturing the functional substrate in the first example of the embodiment of the present disclosure; FIG. 7 is a schematic diagram of an intermediate product formed in a step S14 of the method for manufacturing the functional substrate in the first example of the embodiment of the present disclosure; FIG. 8 is a schematic diagram of an intermediate product formed in a step S15 of the method for manufacturing the functional substrate in the first example of the embodiment of the present disclosure; FIG. 9 is a schematic diagram of an intermediate product formed in a step S16 of the method for manufacturing the functional substrate in the first example of the embodiment of the present disclosure; FIG. 10 is a schematic diagram of an intermediate product formed in a step S17 of the method for manufacturing the functional substrate in the first example of the embodiment of the present disclosure; FIG. 11 is a schematic diagram of an intermediate product formed in a step S18 of the method for manufacturing the functional substrate in the first example of the embodiment of the present disclosure. As shown in FIGS. 4 to 11, the method specifically includes the following steps S11 to S18.

At the step S11, providing a first dielectric substrate 10, and forming a photoresist layer on a first surface of the first dielectric substrate 10.

In some implementations, the first dielectric substrate 10 may be a glass substrate with a thickness ranging from about 0.25 mm to about 0.3 mm. A photosensitive resin material, i.e., the photoresist layer, is coated on the first surface of the first dielectric substrate 10 by a method including but not limited to spin coating, and then is subjected to a pre-baking and shaping for 150 s at a temperature of 110° C. The material of the photoresist layer includes, but is not limited to, BL-301, DL-1000C and the like, and a thickness of the photoresist layer ranges from 2 μm to 10 μm.

At the step S12, exposing, developing and etching the photoresist layer 100 to form a fully exposed region 100a and an unexposed region 100b, and removing the photoresist material in the fully exposed region 100a, and the fully exposed region 100a corresponding to a first connection hole 11 to be formed.

In some implementations, the step S12 specifically includes: exposing and patterning the photoresist layer 100 by using an exposure machine and a mask plate, adjusting an exposure time (which ranges from 8 s to 20 s) according to a thickness of the photoresist layer 100, exposing and developing (which is performed three times within a period of 80 s to 100 s) the resin at positions where TGV openings are to be formed to expose the first dielectric substrate 10 at positions where fully exposed regions 100a are located.

At the step S13, irradiating, by using a laser, the first dielectric substrate 10 at the positions where the fully exposed regions 100a are located to modify molecular bonds of the material of the first dielectric substrate 10 at the positions where the fully exposed regions 100a are located.

In some implementations, in the step S13, the first connection hole 11 may be specifically formed through a laser-induced etching method.

At the step S14, respectively etching the first surface and the second surface of the first dielectric substrate 10 to form the first connection hole 11.

In some implementations, the step S14 may include: respectively etching the first surface and the second surface of the first dielectric substrate 10 by using double-sided etching liquid. The etching rate for the glass modified by the laser is increased, and anisotropic etching in a thickness direction of the first dielectric substrate 10 is realized, and due to the blocking effect of the unexposed region of the photoresist layer, vicinities of the first surface of the first dielectric substrate 10 is isotropically etched by the etching liquid simultaneously, and the isotropic etching and the anisotropic etching are superposed to form a via hole with a structure of a single nail head, that is, the formed first connection hole includes a first sub-hole 111 and a second sub-hole 112. A diameter of the nail head may be adjusted by controlling the etching rate by adjusting a concentration, a temperature and the like of the etching liquid. It should be noted that the diameter of the nail head (i.e. an opening of the second sub-hole 112 on the first surface) is desired to be smaller than a line width of each of first metal wires on the first surface and the second surface, and a pitch between nail heads of adjacent TGV holes is desired to be larger than a line pitch between the first metal wires.

At the step S15, forming a first seed layer 200 in the first connection hole 11, and electroplating the first seed layer 200.

In some implementations, the step S15 may include, but is not limited to: forming an auxiliary film layer by magnetron sputtering, and then continuously sputtering a first conductive film layer as the first seed layer 200, and electroplating the first seed layer.

The auxiliary film layer is used for increasing the adhesive force of the first conductive film layer. A material of the auxiliary film layer includes, but is not limited to, titanium (Ti), and a material of the first conductive film layer includes, but is not limited to, copper (Cu). A thickness of the auxiliary film layer ranges from about 10 nm to about 300 nm, and a thickness of the first conductive film layer ranges from about 30 nm to about 100 nm.

At the step S16, removing portions of the first conductive film layer on a side of the photoresist layer away from the first dielectric substrate 10 and on the second surface of the first dielectric substrate 10 to form a film layer 201.

In some implementations, in the step 16, excess electroplated copper on the side of the photoresist layer away from the first dielectric substrate 10 and on the second surface may be completely removed by using a Chemical Mechanical Polishing (CMP) process.

At the step S17, removing the photoresist layer 100b on the first surface of the first dielectric substrate 10.

In some implementations, in the step S17, the photoresist may be removed by using a striping method to expose a structure of the first conductive film layer protruding from the first surface.

At the step S18, removing a portion of the structure of the first conductive film layer protruding from the first surface to form a first connection electrode 23.

In some implementations, in the step 18, the portion of the structure of the first conductive film layer protruding from the first surface may be removed by using the Chemical Mechanical Polishing (CMP) method.

Since a total length L0 of the first connection hole formed is equal to a thickness (ranging from 250 μm to 300 μm) of the first dielectric substrate 10, a height L1 of the second sub-hole 112 ranges from 5 μm to 20 μm, thermal expansion coefficients of the first connection hole and the first dielectric substrate (glass substrate) 10 are α1 (which is equal to 17.5 ppm/° C.) and α2 (which is equal to 3.2 ppm/° C.), respectively, a maximum temperature during the process of manufacturing the functional substrate is T1, a room temperature is T0, and a variation in temperature is equal to T0–T0. Therefore, a strain amount of the second sub-hole 112 relative to the first dielectric substrate 10 caused by the variation in the temperature in the manufacturing process is:

$$\varepsilon 2 = L1 \times (T1 - T0) \times (\alpha 1 - \alpha 2).$$

The height L1 of the second sub-hole 112 depends on the etching time and is generally selected from a range of 5 μm to 20 μm, herein, it is selected to be 5 μm. In a case where the highest temperature T1 in the manufacturing process is still 230° C., the room temperature T0=25° C., and the strain amount ε2 of the second sub-hole 112 with respect to the first dielectric substrate 10 is equal to 14 nm.

An expansion amount of the first connection hole 11 with the second sub-hole 112 is only 1/50 of a conventional first connection hole 11, so that a stress caused by filling the first connection electrode 23 in the first connection hole 11 can be greatly reduced, the occurrence of defects such as wire breakage and the like can be reduced, and the reliability of the device can be improved.

Second Example

Figure 2:
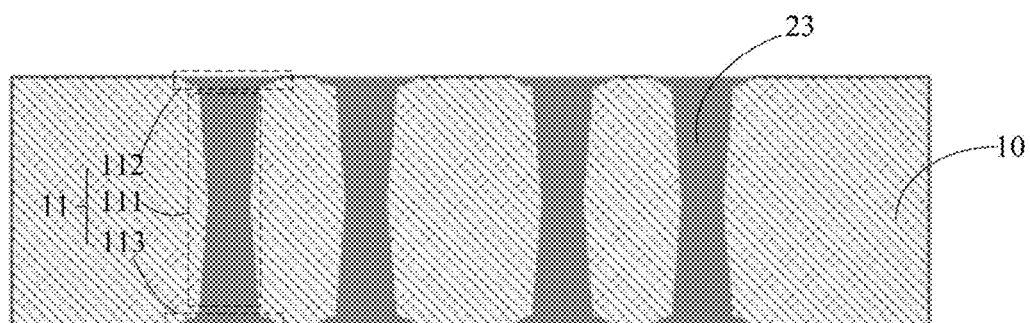
FIG. 2 is a schematic diagram of a functional substrate in a second example of an embodiment of the present disclosure.

FIG. 2 is a schematic diagram of a functional substrate in a second example of an embodiment of the present disclosure; as shown in FIG. 2, a structure of the first connection hole 11 in the second example is similar to that in the first example, except that the first connection hole 11 in the second example includes not only the first sub-hole 111 and the second sub-hole 112, but also a third sub-hole 113 penetrating through the second surface of the first dielectric substrate 10 and communicating with the first sub-hole 111. An opening width of the third sub-hole 113 decreases monotonically in a direction away from the second surface, and a minimum opening width of the third sub-hole 113 is not smaller than the maximum opening width of the first sub-hole 111; a corner is formed at a position where the first sub-hole 111 and the third sub-hole 113 are connected. That is, both ends of the first connection hole 11 are formed into structures of nail heads, which can reduce the influence of thermal stress during a conductive structure connected to the first connection electrode 23 being formed on the second surface, as well as the influence of thermal stress during a conductive structure connected to the first connection electrode 23 being formed on the first surface, thereby reducing the occurrence of defects such as wire breakage on the first surface and the second surface.

Figure 12:
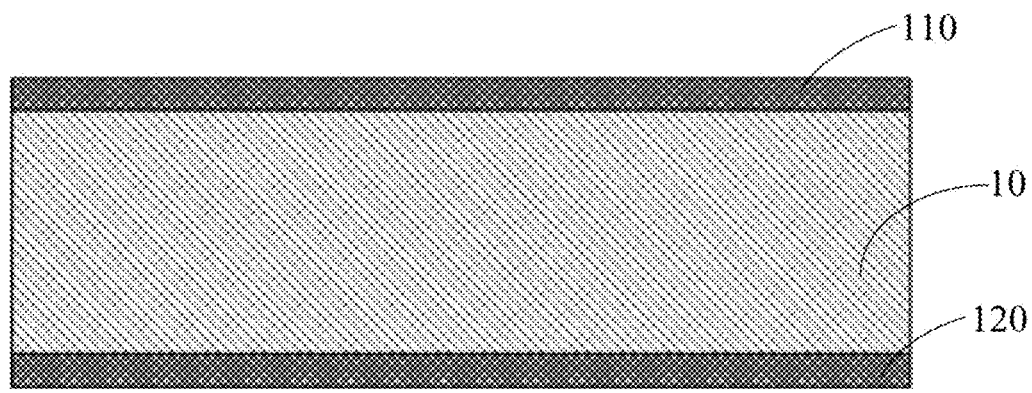
FIG. 12 is a schematic diagram of an intermediate product formed in a step S21 of a method for manufacturing the functional substrate in the second example of the embodiment of the present disclosure.
Figure 13:
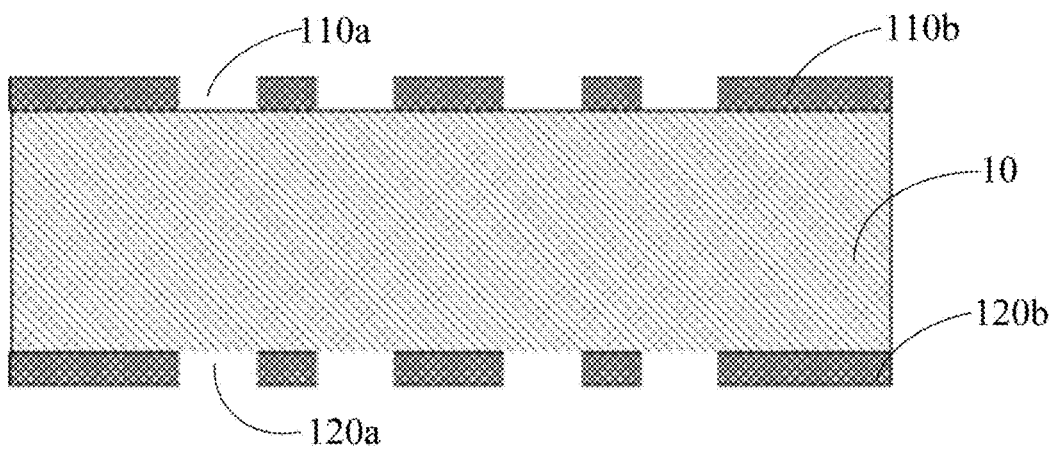
FIG. 13 is a schematic diagram of an intermediate product formed in a step S22 of the method for manufacturing the functional substrate in the second example of the embodiment of the present disclosure.
Figure 14:
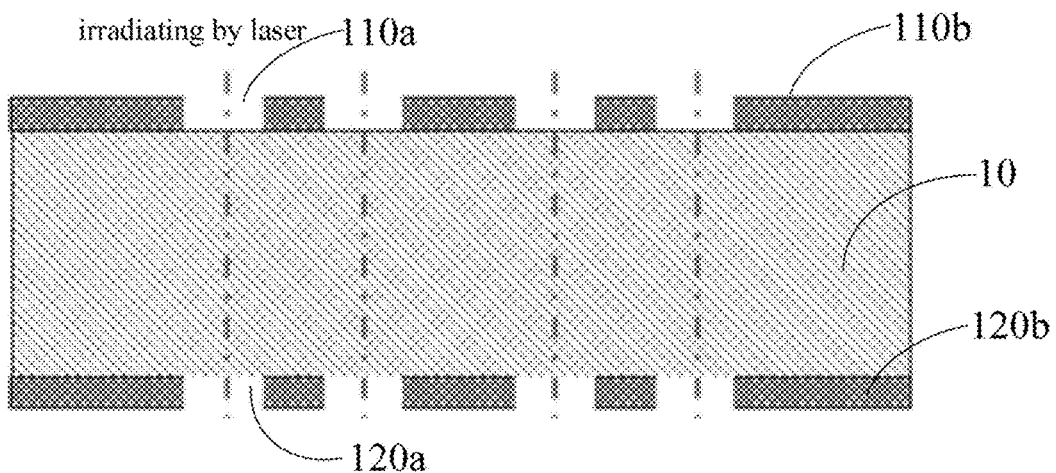
FIG. 14 is a schematic diagram of an intermediate product formed in a step S23 of the method for manufacturing the functional substrate in the second example of the embodiment of the present disclosure.
Figure 15:
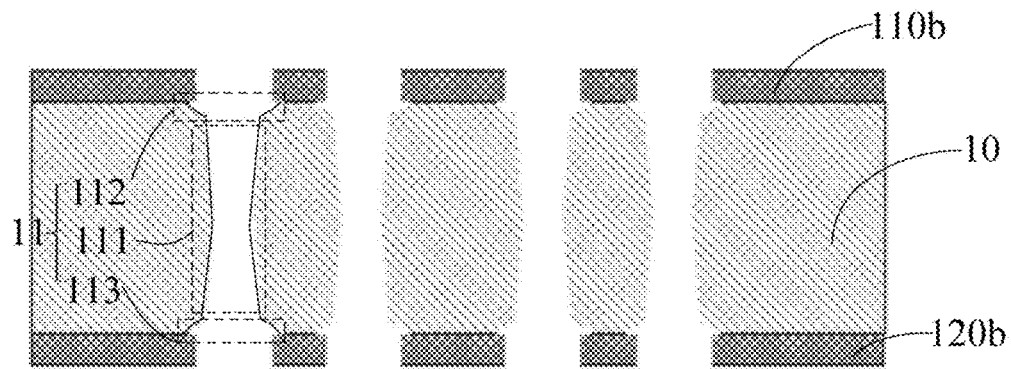
FIG. 15 is a schematic diagram of an intermediate product formed in a step S24 of the method for manufacturing the functional substrate in the second example of the embodiment of the present disclosure.
Figure 16:
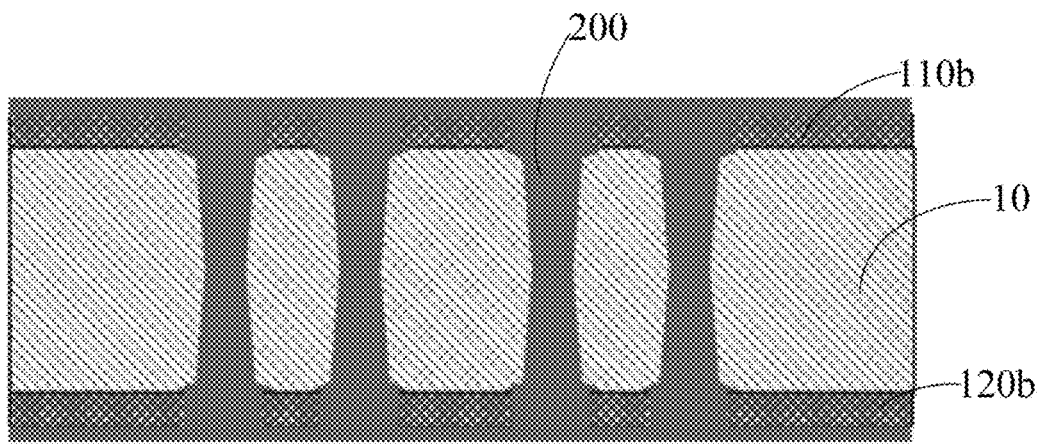
FIG. 16 is a schematic diagram of an intermediate product formed in a step S25 of the method for manufacturing the functional substrate in the second example of the embodiment of the present disclosure.
Figure 17:
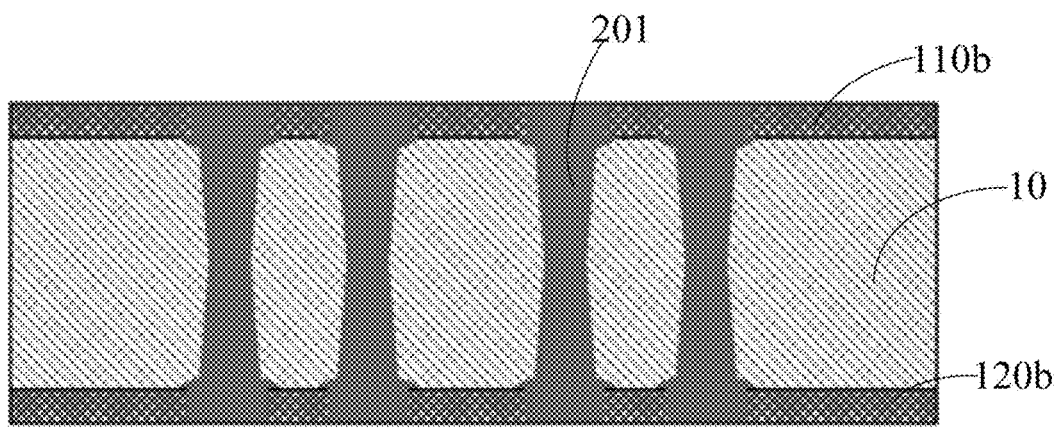
FIG. 17 is a schematic diagram of an intermediate product formed in a step S26 of the method for manufacturing the functional substrate in the second example of the embodiment of the present disclosure.
Figure 18:
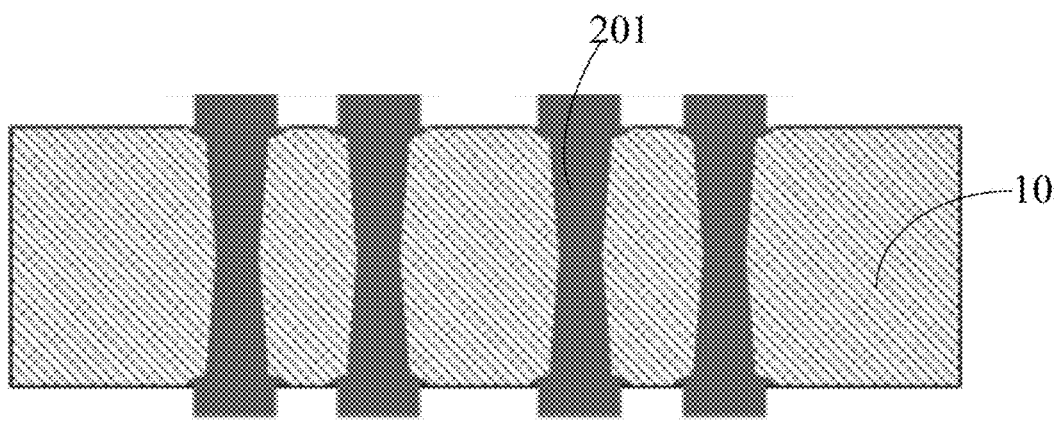
FIG. 18 is a schematic diagram of an intermediate product formed in a step S27 of the method for manufacturing the functional substrate in the second example of the embodiment of the present disclosure.
Figure 19:
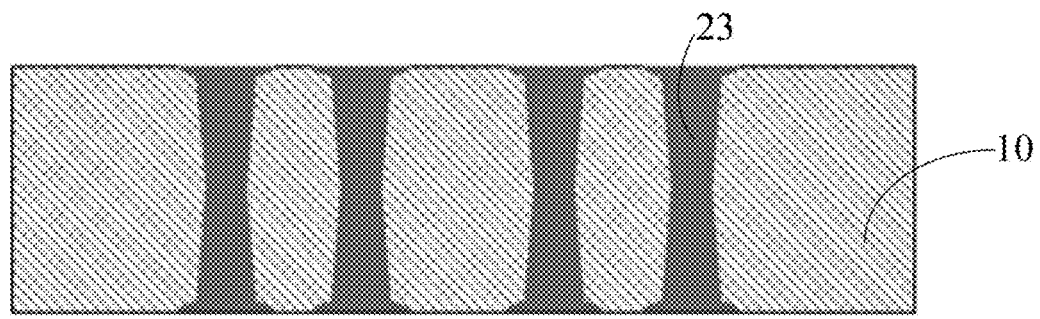
FIG. 19 is a schematic diagram of an intermediate product formed in a step S28 of the method for manufacturing the functional substrate in the second example of the embodiment of the present disclosure.

For the functional substrate described above, an embodiment of the present disclosure provides a method for manufacturing the functional substrate. FIG. 12 is a schematic diagram of an intermediate product formed in a step S21 of a method for manufacturing the functional substrate in the second example of the embodiment of the present disclosure; FIG. 13 is a schematic diagram of an intermediate product formed in a step S22 of the method for manufacturing the functional substrate in the second example of the embodiment of the present disclosure; FIG. 14 is a schematic diagram of an intermediate product formed in a step S23 of the method for manufacturing the functional substrate in the second example of the embodiment of the present disclosure; FIG. 15 is a schematic diagram of an intermediate product formed in a step S24 of the method for manufacturing the functional substrate in the second example of the embodiment of the present disclosure; FIG. 16 is a schematic diagram of an intermediate product formed in a step S25 of the method for manufacturing the functional substrate in the second example of the embodiment of the present disclosure; FIG. 17 is a schematic diagram of an intermediate product formed in a step S26 of the method for manufacturing the functional substrate in the second example of the embodiment of the present disclosure; FIG. 18 is a schematic diagram of an intermediate product formed in a step S27 of the method for manufacturing the functional substrate in the second example of the embodiment of the present disclosure; FIG. 19 is a schematic diagram of an intermediate product formed in a step S28 of the method for manufacturing the functional substrate in the second example of the embodiment of the present disclosure. As shown in FIGS. 12 to 19, the method specifically includes following steps S21 to S28.

At the step S21, providing the first dielectric substrate 10, forming a first photoresist layer 110 on the first surface of the first dielectric substrate 10, and forming a second photoresist layer 120 on the second surface.

In some implementations, the first dielectric substrate 10 may be a glass substrate with a thickness ranging from about 0.25 mm to about 0.3 mm. A photosensitive resin material is formed on the first surface and the second surface of the first dielectric substrate 10 by a method including but not limited to spin coating, that is, a first photoresist layer is coated on the first surface of the first dielectric substrate 10, a second photoresist layer is coated on the second surface of the first dielectric substrate 10, and then the first photoresist layer and the second photoresist layer are subjected to a pre-baking and shaping for 150 s at a temperature of 110° C. The materials of the first photoresist layer and the second photoresist layer include, but are not limited to, BL-301, DL-1000C and the like, and a thickness of each of the first photoresist layer and the second photoresist layer ranges form 2 μm to 10 μm.

At the step S22, exposing, developing and etching the first photoresist layer 110 and the second photoresist layer 120 respectively to form a first fully exposed region 110a and a first unexposed region 110b, and a second fully exposed region 120a and a second unexposed region 120b, and removing the photoresist material of the first fully exposed region 110a and the second fully exposed region 120a, the first fully exposed region 110a and the second fully exposed region 120a corresponding to a first connection hole 11 to be formed.

In some implementations, the step S22 specifically includes: exposing and patterning the first photoresist layer and the second photoresist layer respectively by using an exposure machine and a corresponding mask plate, adjusting an exposure time (which ranges from 8 s to 20 s) according to the thickness of each of the first photoresist layer 110 and the second photoresist layer 120, exposing and developing (which is performed three times within a period of 80 s to 100 s) the resin at positions where TGV openings are to be formed to expose the first dielectric substrate 10 at positions where first fully exposed regions 110a and second fully exposed regions 120a are located.

At the step S23, irradiating, by using a laser, the first dielectric substrate 10 at the positions where the first fully exposed regions 110a and the second fully exposed regions 120a are located to modify molecular bonds of the material of the first dielectric substrate 10 at the positions where the first fully exposed regions 110a and the second fully exposed regions 120a are located.

In some implementations, in the step S23, the first connection hole 11 may be specifically formed by using a laser-induced etching method.

At the step S24, respectively etching the first surface and the second surface of the first dielectric substrate 10 to form the first connection hole 11.

In some implementations, the step S24 may include: respectively etching the first surface and the second surface of the first dielectric substrate 10 by using double-sided etching liquid. The etching rate for the glass modified by the laser is increased, and anisotropic etching is realized in a thickness direction of the first dielectric substrate 10, and due to the blocking effect of the first unexposed region 110b of the first photoresist layer 110 and the second unexposed region 120b of the second photoresist layer 120, vicinities of the first surface of the first dielectric substrate 10 is isotropically etched by the etching liquid simultaneously, and the isotropic etching and the anisotropic etching are superposed to form a via hole with a structure of a single nail head, that is, the formed first connection hole includes a first sub-hole 111, a second sub-hole 112 and a third sub-hole 113. A diameter of the nail head may be adjusted by controlling the etching rate by adjusting a concentration, a temperature and the like of the etching liquid. It should be noted that the diameter of the nail head (i.e. an opening of the second sub-hole 112 on the first surface) is desired to be smaller than a line width of each of first metal wires on the first surface and the second surface, and a pitch between nail heads of adjacent TGV holes is desired to be larger than a line pitch between the first metal wires.

At the step S25, forming a first seed layer 200 in the first connection hole 11, and electroplating the first seed layer 200.

In some implementations, the step S25 may include, but is not limited to: forming an auxiliary film layer by magnetron sputtering, and then continuously sputtering a first conductive film layer as the first seed layer 200, and electroplating the first seed layer 200.

The auxiliary film layer is used for increasing the adhesive force of the first conductive film layer. A material of the auxiliary film layer includes, but is not limited to, titanium (Ti), and a material of the first conductive film layer includes, but is not limited to, copper (Cu). A thickness of the auxiliary film layer ranges from about 10 nm to 300 nm, and a thickness of the first conductive film layer ranges from about 30 nm to 100 nm.

At the step S26, removing portions of the first conductive film layer on a side of the first photoresist layer and a side of the second photoresist layer away from the first dielectric substrate 10.

In some implementations, in the step S26, the excess electroplated copper on the sides of the first photoresist layer and the second photoresist layer away from the first dielectric substrate 10 may be removed by using a Chemical Mechanical Polishing (CMP) process.

At the step S27, removing the first photoresist layer 110b on the first surface of the first dielectric substrate 10 and the second photoresist layer 120b on the second surface of the first dielectric substrate 10.

In some implementations, in the step S27, the photoresist may be removed by using a striping method to expose a structure 201 of the first conductive film layer protruding from the first surface and the second surface of the first dielectric substrate.

At the step S28, removing portions of the structure of the first conductive film layer protruding from the first surface and the second surface of the first dielectric substrate to form a first connection electrode 23.

In some implementations, in the step 28, the portions of the structure of the first conductive film layer protruding from the first surface and the second surface are removed by using the Chemical Mechanical Polishing (CMP) method.

The solution of the first connection hole 11 with double nail heads has a characteristic of relieving double-sided RDL stress, and is mainly applied to manufacturing of three-dimensional glass-based devices with double-sided RDL metal wiring and a glass-based carrier plate with a relatively large thickness.

Third Example

Figure 3:
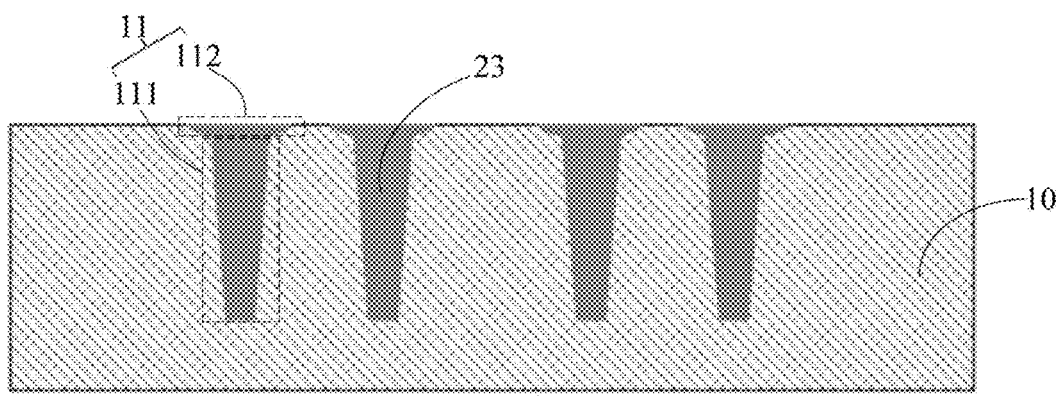
FIG. 3 is a schematic diagram of a functional substrate in a third example of the embodiment of the present disclosure.

FIG. 3 is a schematic diagram of a functional substrate in a third example of an embodiment of the present disclosure; as shown in FIG. 3, the first connection hole 11 in the functional substrate of the present example may be a blind hole, the first connection hole 11 includes a first sub-hole 111 and a second sub-hole 112, the first sub-hole 111 is different from that in the first example, the first sub-hole 111 in the first example is formed by double-sided etching and thus has an hourglass shape, and in the present example, the second sub-hole 112 has an inverted trapezoid shape.

Figure 20:
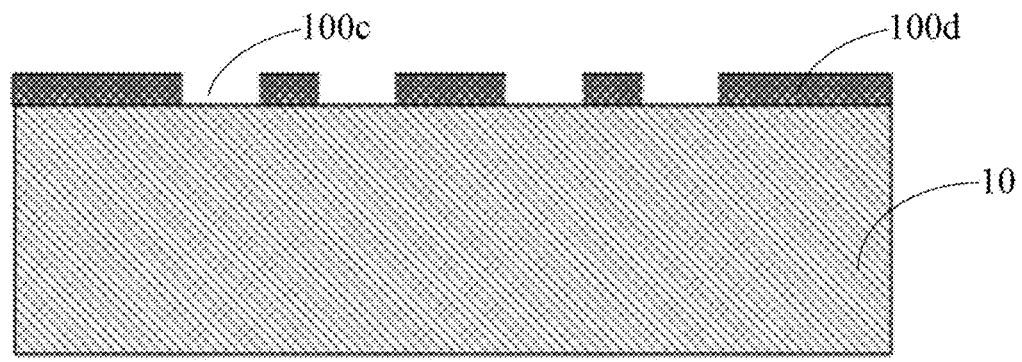
FIG. 20 is a schematic diagram of an intermediate product formed in a step S31 of a method for manufacturing the functional substrate in the third example of the embodiment of the present disclosure.
Figure 21:
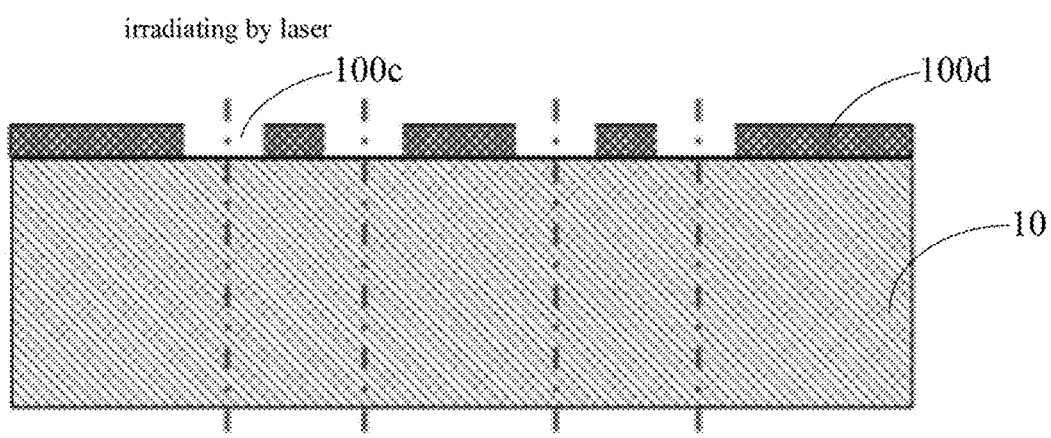
FIG. 21 is a schematic diagram of an intermediate product formed in a step S32 of the method for manufacturing the functional substrate in the third example of the embodiment of the present disclosure.
Figure 22:
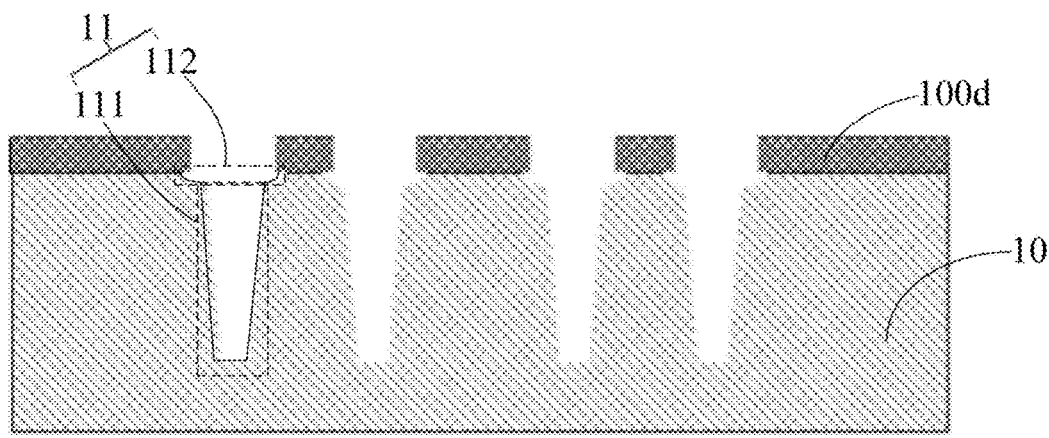
FIG. 22 is a schematic diagram of an intermediate product formed in a step S33 of the method for manufacturing the functional substrate in the third example of the embodiment of the present disclosure.
Figure 23:
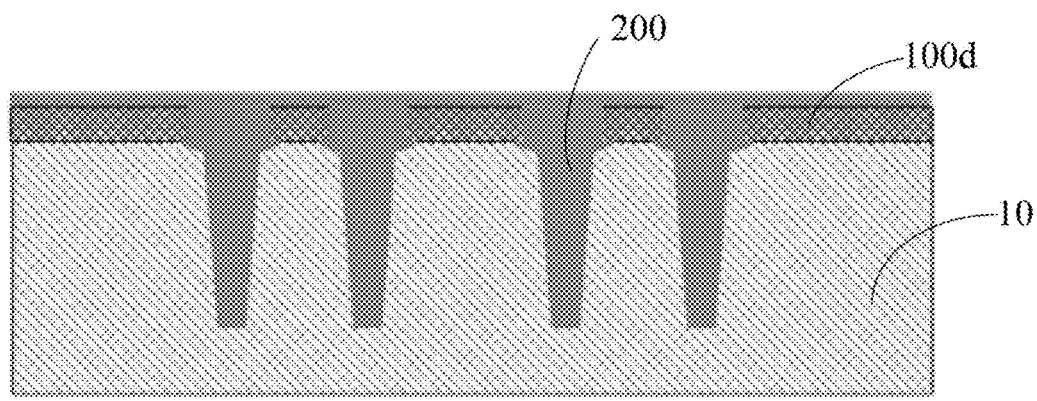
FIG. 23 is a schematic diagram of an intermediate product formed in a step S34 of the method for manufacturing the functional substrate in the third example of the embodiment of the present disclosure.
Figure 24:
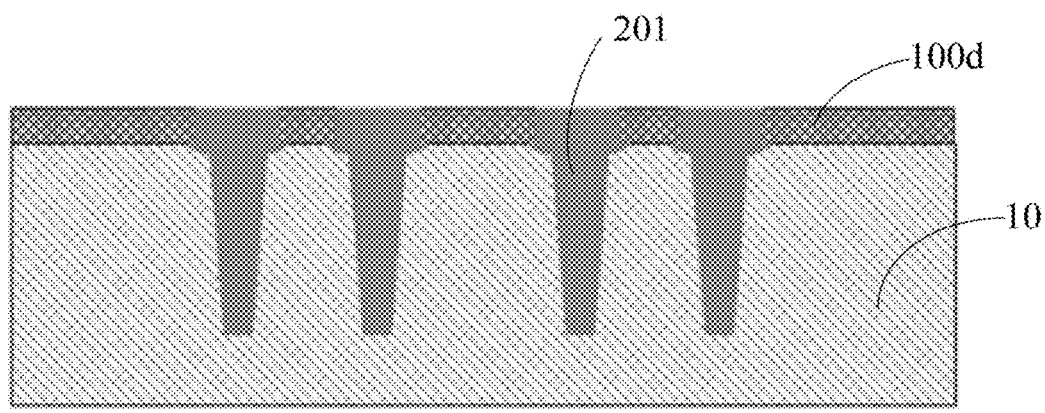
FIG. 24 is a schematic diagram of an intermediate product formed in a step S35 of the method for manufacturing the functional substrate in the third example of the embodiment of the present disclosure.
Figure 25:
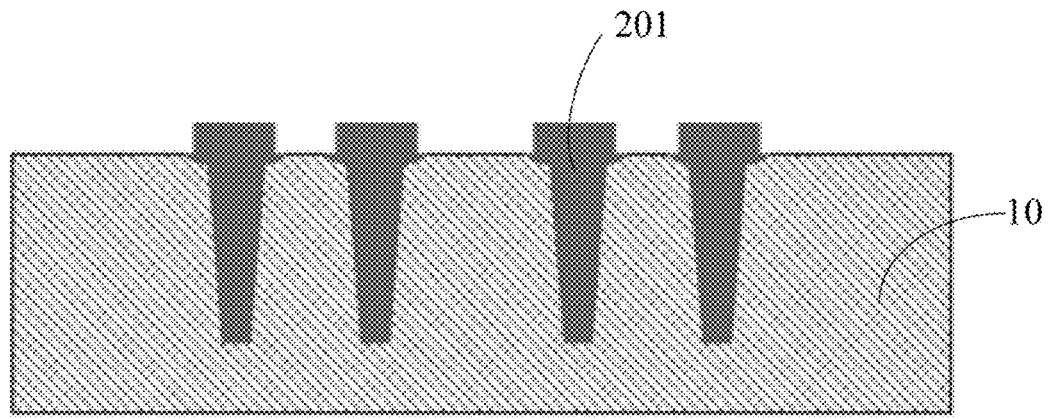
FIG. 25 is a schematic diagram of an intermediate product formed in a step S36 of the method for manufacturing the functional substrate in the third example of the embodiment of the present disclosure.
Figure 26:
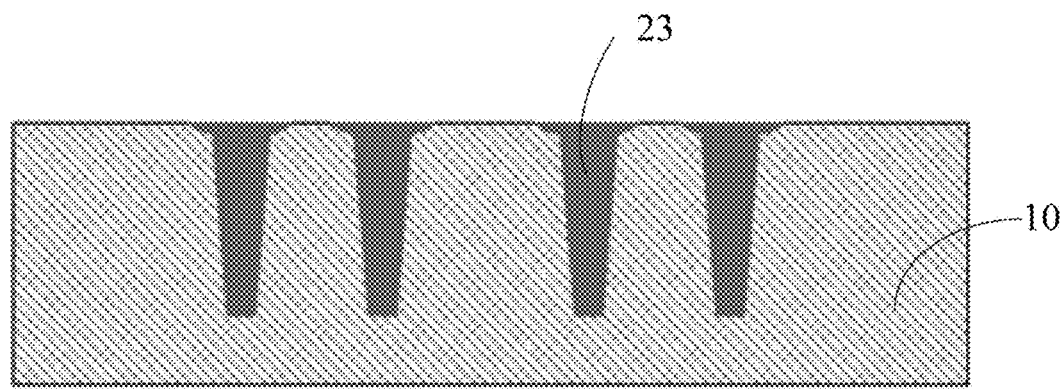
FIG. 26 is a schematic diagram of an intermediate product formed in a step S37 of the method for manufacturing the functional substrate in the third example of the embodiment of the present disclosure.

For the functional substrate, an embodiment of the present disclosure provides a method for manufacturing the functional substrate. FIG. 20 is a schematic diagram of an intermediate product formed in a step S31 of a method for manufacturing the functional substrate in the third example of the embodiment of the present disclosure; FIG. 21 is a schematic diagram of an intermediate product formed in a step S32 of the method for manufacturing the functional substrate in the third example of the embodiment of the present disclosure; FIG. 22 is a schematic diagram of an intermediate product formed in a step S33 of the method for manufacturing the functional substrate in the third example of the embodiment of the present disclosure; FIG. 23 is a schematic diagram of an intermediate product formed in a step S34 of the method for manufacturing the functional substrate in the third example of the embodiment of the present disclosure; FIG. 24 is a schematic diagram of an intermediate product formed in a step S35 of the method for manufacturing the functional substrate in the third example of the embodiment of the present disclosure; FIG. 25 is a schematic diagram of an intermediate product formed in a step S36 of the method for manufacturing the functional substrate in the third example of the embodiment of the present disclosure; and FIG. 26 is a schematic diagram of an intermediate product formed in a step S37 of the method for manufacturing the functional substrate in the third example of the embodiment of the present disclosure. As shown in FIGS. 20 to 26, the method specifically includes following steps S31 to S37.

At the step S31, providing a first dielectric substrate 10, and forming a photoresist layer on a first surface of the first dielectric substrate 10; exposing, developing and etching the photoresist layer to form a third fully exposed region 100c and a fourth unexposed region 100d, and removing the photoresist material in the third fully exposed region 100c, the third fully exposed region 100c corresponding to a first connection hole 11 to be formed.

In some implementations, the first dielectric substrate 10 may be a glass substrate with a thickness ranging from about 0.25 mm to about 0.3 mm. A photosensitive resin material, i.e., a photoresist layer, is coated on the first surface of the first dielectric substrate 10 by a method including but not limited to spin coating, and then is subjected to a pre-baking and shaping for 150 s at a temperature of 110° C. A material of the photoresist layer includes, but is not limited to, BL-301, DL-1000C and the like, and a thickness of the photoresist layer ranges from 2 μm to 10 μm.

The photoresist layer is exposed by using an exposure machine and a corresponding mask plate, an exposure time (which ranges from 8 s to 20 s) is adjusted according to the thickness of the photoresist layer, the resin at positions where TGV openings are to be formed is exposed and developed (for three times within a period of 80 s to 100 s) to expose the first dielectric substrate 10 at positions where fully exposed regions 100c are located.

At the step S32, irradiating, by using a laser, the first dielectric substrate 10 at the positions where the third fully exposed regions 100c are located to modify molecular bonds of the material of the first dielectric substrate 10 at the positions where the third fully exposed regions 100c are located.

In some implementations, in the step S32, the first connection hole 11 may be specifically formed through a laser-induced etching method.

At the step S33, etching the first surface of the first dielectric substrate 10 to form the first connection hole 11.

In some implementations, the step S33 may include: etching the first surface of the first dielectric substrate 10 by using etching solution. The etching rate for the glass modified by the laser is increased, and anisotropic etching in a thickness direction of the first dielectric substrate 10 is realized, and due to the blocking effect of the unexposed region of the photoresist layer, vicinities of the first surface of the first dielectric substrate 10 is isotropically etched by the etching liquid simultaneously, and the isotropic etching and the anisotropic etching are superposed to form a via hole with a structure of a single nail head, that is, the formed first connection hole includes a first sub-hole 111 and a second sub-hole 112. A diameter of the nail head may be adjusted by controlling the etching rate by adjusting a concentration, a temperature and the like of the etching liquid. It should be noted that the diameter of the nail head (i.e. an opening of the second sub-hole 112 on the first surface) is desired to be smaller than a line width of each of first metal wires on the first surface and the second surface, and a pitch between nail heads of adjacent TGV holes is desired to be larger than a line pitch between the first metal wires.

At the step S34, forming a first seed layer 200 in the first connection hole 11, and electroplating the first seed layer 200.

In some implementations, the step S34 may include, but is not limited to: forming an auxiliary film layer by magnetron sputtering, and then continuously sputtering a first conductive film layer as the first seed layer 200, and electroplating the first seed layer.

The auxiliary film layer is used for increasing the adhesive force of the first conductive film layer. A material of the auxiliary film layer includes, but is not limited to, titanium (Ti), and a material of the first conductive film layer includes, but is not limited to, copper (Cu). A thickness of the auxiliary film layer ranges from about 10 nm to about 300 nm, and a thickness of the first conductive film layer ranges from about 30 nm to about 100 nm.

At the step S35, removing a portion of the first conductive film layer on a side of the photoresist layer away from the first dielectric substrate 10.

In some implementations, in the step 35, excess electroplated copper on the side of the photoresist layer away from the first dielectric substrate 10 may be removed by using a Chemical Mechanical Polishing (CMP) process.

At the step S36, removing the photoresist layer on the first surface of the first dielectric substrate 10.

In some implementations, in the step S36, the photoresist may be removed by using a stripping method to expose a structure 201 of the first conductive film layer protruding from the first surface.

At the step S37, removing the portion of the structure of the first conductive film layer protruding from the first surface of the first dielectric substrate to form a first connection electrode 23.

In some implementations, in the step 37, the portion of the structure of the first conductive film layer protruding from the first surface may be completely removed by using the Chemical Mechanical Polishing (CMP) method.

Figure 27:
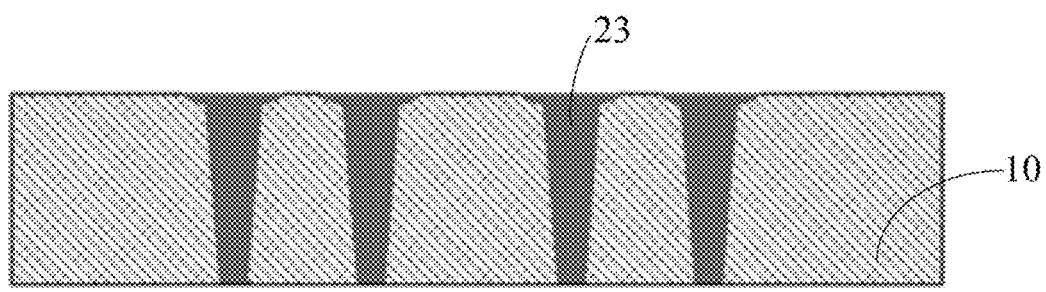
FIG. 27 is a schematic diagram of an intermediate product formed after the step S37 of the method for manufacturing the functional substrate in the fourth example of the embodiment of the present disclosure.

It should be noted that, after the step S37, the second surface of the first dielectric substrate 10 may be thinned to expose the first connection electrode 23, so as to subsequently form a metal wire structure on the second surface, as shown in FIG. 27.

Fourth Example

The present example is substantially the same in structure as the second example, except that, in the present example, a first buffer layer is formed on the first surface and a second buffer layer is formed on the second surface. Resin materials such as photoresist may be adopted for the first buffer layer and the second buffer layer. In such case, the photoresist layer used for modifying the first dielectric substrate 10 may be used for both the first buffer layer and the second buffer layer, which is explained below in combination with the following method.

Figure 28:
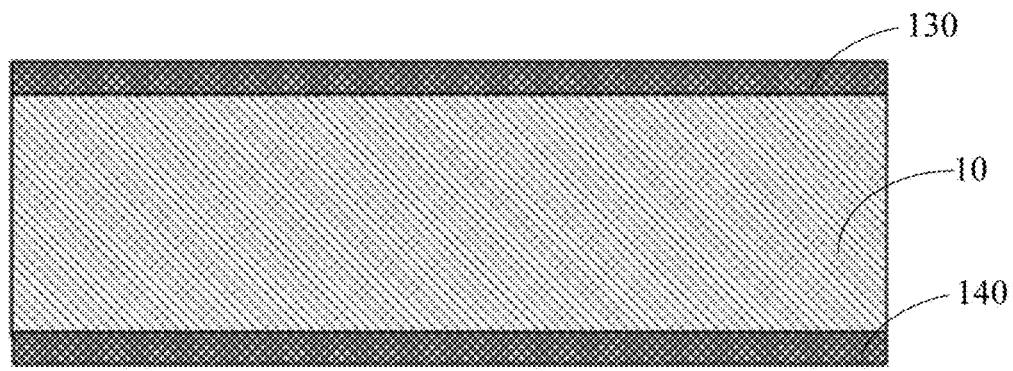
FIG. 28 is a schematic diagram of an intermediate product formed in a step S41 of a method for manufacturing the functional substrate in the fourth example of the embodiment of the present disclosure.
Figure 29:
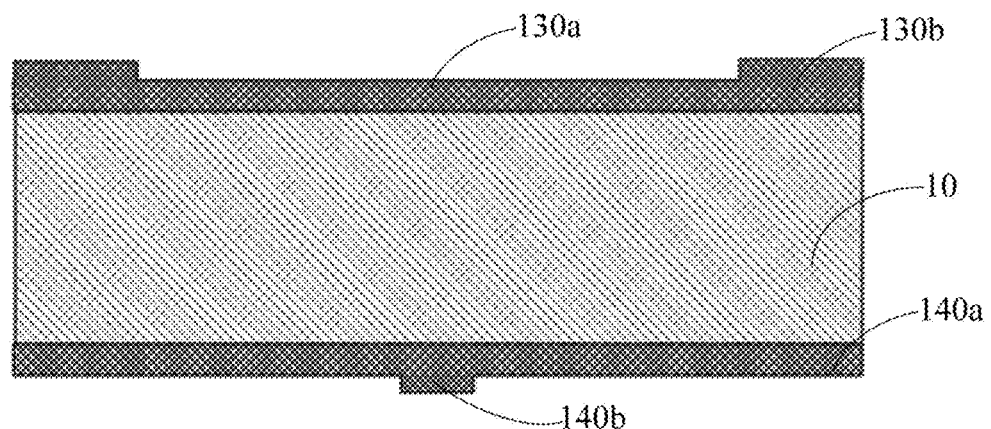
FIG. 29 is a schematic diagram of an intermediate product formed in a step S42 of the method for manufacturing the functional substrate in the fourth example of the embodiment of the present disclosure.
Figure 30:
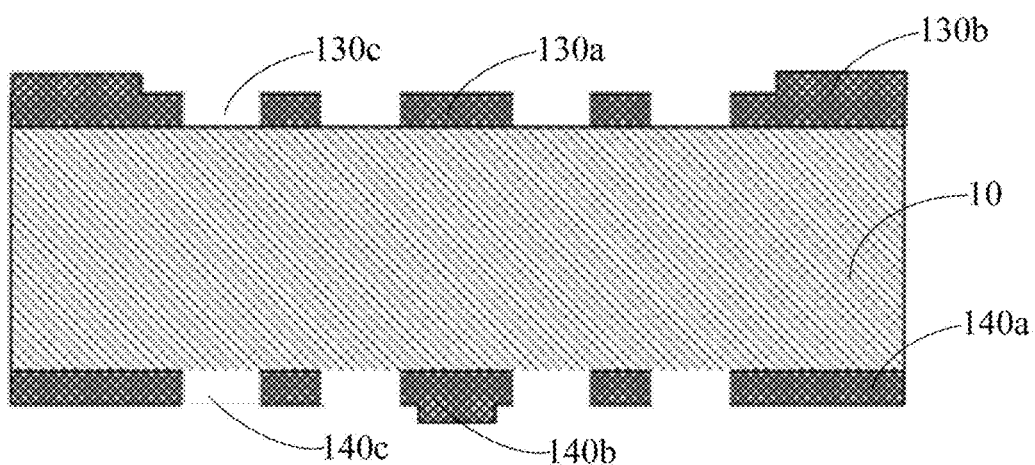
FIG. 30 is a schematic diagram of an intermediate product formed in a step S43 of the method for manufacturing the functional substrate in the fourth example of the embodiment of the present disclosure.
Figure 31:
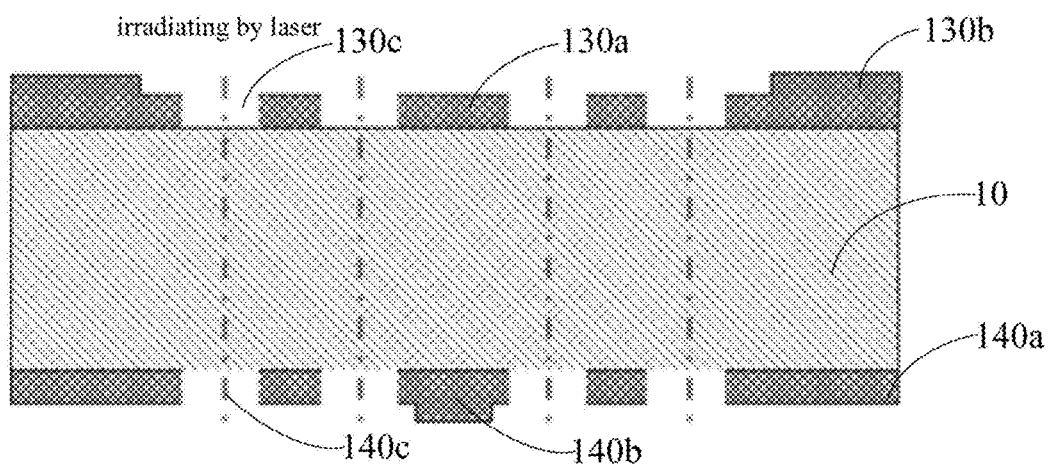
FIG. 31 is a schematic diagram of an intermediate product formed in a step S44 of the method for manufacturing the functional substrate in the fourth example of the embodiment of the present disclosure.
Figure 32:
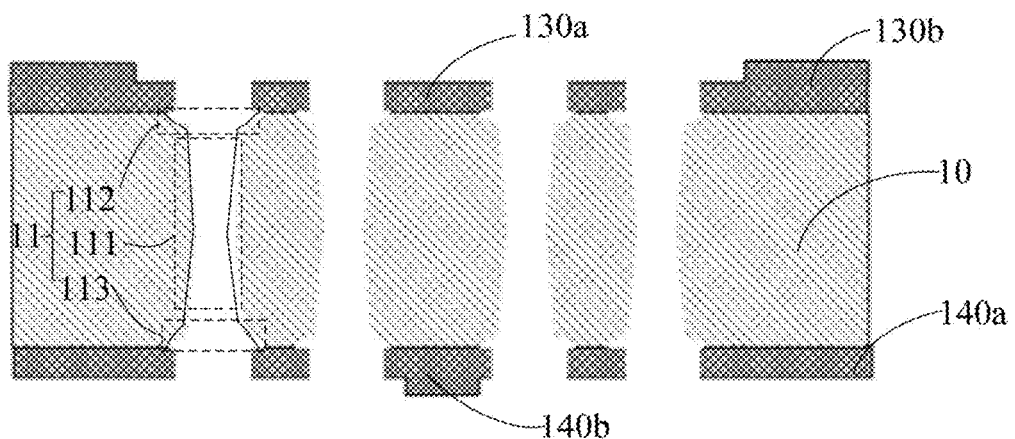
FIG. 32 is a schematic diagram of an intermediate product formed in a step S45 of the method for manufacturing the functional substrate in the fourth example of the embodiment of the present disclosure.
Figure 33:
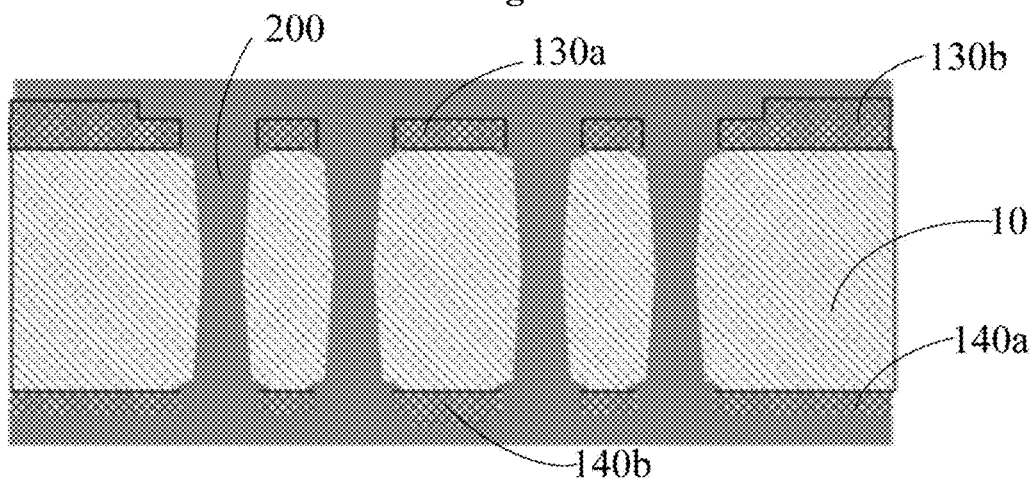
FIG. 33 is a schematic diagram of an intermediate product formed in a step S46 of the method for manufacturing the functional substrate in the fourth example of the embodiment of the present disclosure.
Figure 34:
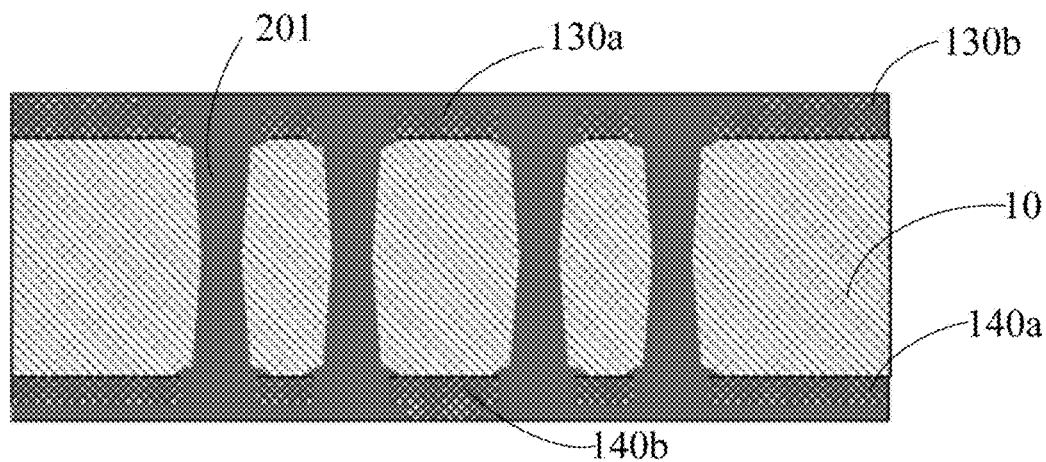
FIG. 34 is a schematic diagram of an intermediate product formed in a step S47 of the method for manufacturing the functional substrate in the fourth example of the embodiment of the present disclosure.

For the functional substrate, an embodiment of the present disclosure provides a method for manufacturing the functional substrate. FIG. 28 is a schematic diagram of an intermediate product formed in a step S41 of a method for manufacturing the functional substrate in the fourth example of the embodiment of the present disclosure; FIG. 29 is a schematic diagram of an intermediate product formed in a step S42 of the method for manufacturing the functional substrate in the fourth example of the embodiment of the present disclosure; FIG. 30 is a schematic diagram of an intermediate product formed in a step S43 of the method for manufacturing the functional substrate in the fourth example of the embodiment of the present disclosure; FIG. 31 is a schematic diagram of an intermediate product formed in a step S44 of the method for manufacturing the functional substrate in the fourth example of the embodiment of the present disclosure; FIG. 32 is a schematic diagram of an intermediate product formed in a step S45 of the method for manufacturing the functional substrate in the fourth example of the embodiment of the present disclosure; FIG. 33 is a schematic diagram of an intermediate product formed in a step S46 of the method for manufacturing the functional substrate in the fourth example of the embodiment of the present disclosure; FIG. 34 is a schematic diagram of an intermediate product formed in a step S47 of the method for manufacturing the functional substrate in the fourth example of the embodiment of the present disclosure. As shown in FIGS. 28 to 34, the method specifically includes following steps S41 to S47.

At the step S41, providing a first dielectric substrate 10, forming a third photoresist layer 130 on a first surface of the first dielectric substrate 10, and forming a fourth photoresist layer 140 on a second surface of the first dielectric substrate 10.

In some implementations, the first dielectric substrate 10 may be a glass substrate with a thickness ranging from about 0.25 mm to about 0.3 mm. A photosensitive resin material is formed on the first surface and the second surface of the first dielectric substrate 10 by a method including but not limited to spin coating, that is, the third photoresist layer 130 is coated on the first surface of the first dielectric substrate 10, the fourth photoresist layer 140 is coated on the second surface of the first dielectric substrate 10, and then the third photoresist layer 130 and the fourth photoresist layer 140 are subjected to a pre-baking and shaping for 150 s at a temperature of 110° C. The materials of the third photoresist layer 130 and the fourth photoresist layer 140 include, but are not limited to, BL-301, DL-1000C and the like, and a thickness of each of the third photoresist layer 130 and the fourth photoresist layer 140 ranges form 2 μm to 10 μm.

At the step S42, exposing, developing and etching the third photoresist layer 130 and the fourth photoresist layer 140 respectively to form a first half-exposed region 130a and a fourth unexposed region 130b, and a second half-exposed region 140a and a fifth unexposed region 140b, and removing portions of the photoresist materials in the first half-exposed region 130a and the second half-exposed region 140a.

In some implementations, step S42 specifically includes: exposing the third photoresist layer 130 and the fourth photoresist layer 140 respectively by using an exposure machine and a corresponding mask plate, adjusting an exposure time (which ranges from 8 s to 20 s) according to the thickness of each of the third photoresist layer 130 and the fourth photoresist layer 140, exposing and developing (which is performed three times within a period of 80 s to 100 s) the resin at positions where TGV openings are to be formed.

At the step S43, exposing, developing and etching the photoresist in the first half-exposed region 130a and the second half-exposed region 140a to form a fourth fully exposed region 130c and a fifth fully exposed region 140c.

In some implementations, the step S43 specifically includes: exposing and patterning the third photoresist layer 130 and the fourth photoresist layer 140 respectively by using an exposure machine and a corresponding mask plate, adjusting an exposure time (which ranges from 8 s to 20 s) according to the thickness of each of the third photoresist layer 130 and the fourth photoresist layer 140, exposing and developing (which is performed three times within a period of 80 s to 100 s) the resin at positions where TGV openings are to be formed to expose the first dielectric substrate 10 at positions where fourth fully exposed regions 130c and fifth fully exposed regions 140c are located.

At the step S44, irradiating, by using a laser, the first dielectric substrate 10 at the positions where the fourth fully exposed regions 130c and the fifth fully exposed regions 140c are located to modify molecular bonds of the material of the first dielectric substrate 10 at the positions where the fourth fully exposed regions 130c and the fifth fully exposed regions 140c are located, respectively.

In some implementations, in the step S44, the first connection hole 11 may be specifically formed by using a laser-induced etching method.

At the step S45, respectively etching the first surface and the second surface of the first dielectric substrate 10 to form the first connection hole 11.

In some implementations, the step S45 may include: respectively etching the first surface and the second surface of the first dielectric substrate 10 by using double-sided etching liquid. The etching rate for the glass modified by the laser is increased, and anisotropic etching is realized in a thickness direction of the first dielectric substrate 10, and due to the blocking effect of the third photoresist layer 130 and the fourth photoresist layer 140, vicinities of the first surface of the first dielectric substrate 10 are isotropically etched by the etching liquid simultaneously, and the isotropic etching and the anisotropic etching are superposed to form a via hole with a structure of double nail heads, that is, the formed first connection hole includes a first sub-hole 111, a second sub-hole 112 and a third sub-hole 113. A diameter of the nail head may be adjusted by controlling the etching rate by adjusting a concentration, a temperature and the like of the etching liquid. It should be noted that the diameter of the nail head (i.e. an opening of the second sub-hole 112 on the first surface) is desired to be smaller than a line width of each of first metal wires on the first surface and the second surface, and a pitch between the nail heads of adjacent TGV holes is desired to be larger than a line pitch between the first metal wires.

At the step S46, forming a first seed layer 200 in the first connection hole 11, and electroplating the first seed layer 200.

In some implementations, the step S46 may include, but is not limited to: forming an auxiliary film layer by magnetron sputtering, and then continuously sputtering a first conductive film layer as the first seed layer 200, and electroplating the first seed layer.

The auxiliary film layer is used for increasing the adhesive force of the first conductive film layer. A material of the auxiliary film layer includes, but is not limited to, titanium (Ti), and a material of the first conductive film layer includes, but is not limited to, copper (Cu). A thickness of the auxiliary film layer ranges from about 10 nm to about 300 nm, and a thickness of the first conductive film layer ranges from about 30 nm to about 100 nm.

At the step S47, removing portions of the first conductive film layer on a side of the third photoresist layer 130b and a side the fourth photoresist layer 140b away from the first dielectric substrate 10 to form a first buffer layer and a second buffer layer (i.e., the remained portions of the third photoresist layer and the fourth photoresist layer).

In some implementations, in the step 47, excess electroplated copper on the sides of the photoresist layer away from the first dielectric substrate 10 may be completely removed by using a Chemical Mechanical Polishing (CMP) process.

The methods for manufacturing the first connection hole 11 and the first connection electrode 23 of the functional substrate in the four examples are given above. The functional substrate of each embodiment of the present disclosure may include not only the above structure but also a first conductive layer on the first surface of the first dielectric substrate, and certainly, in a case where the first connection hole 11 is a through hole, the functional substrate may further include a second conductive layer on the second surface of the first dielectric substrate.

Figure 35:
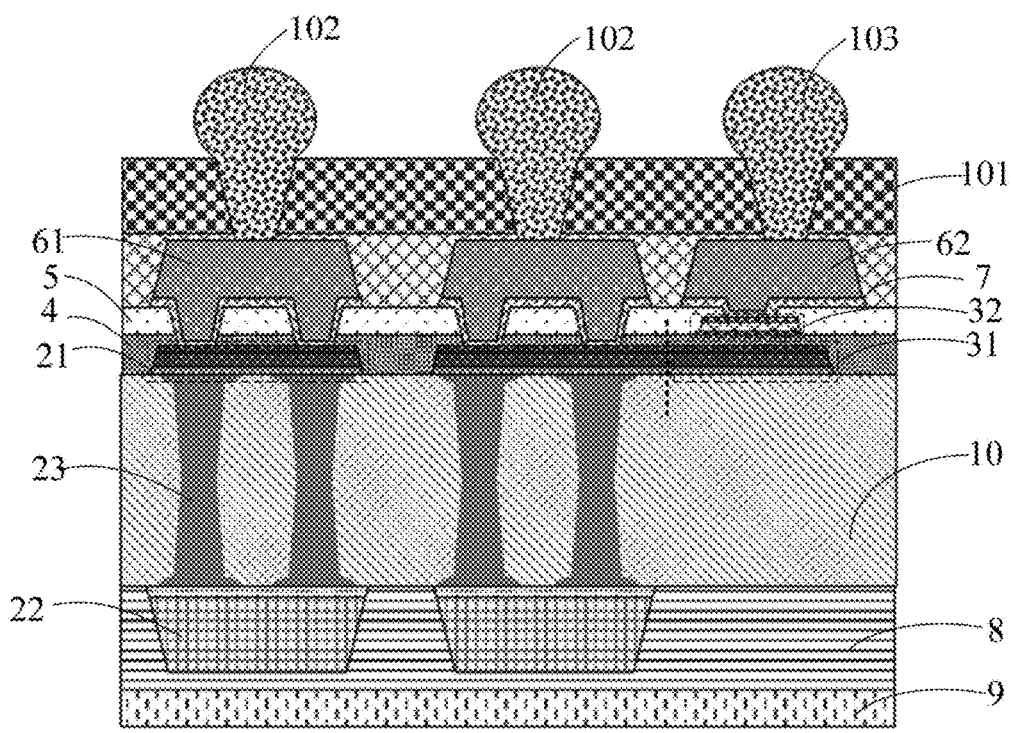
FIG. 35 is a schematic structural diagram of a functional substrate in an embodiment of the present disclosure.
Figure 36:
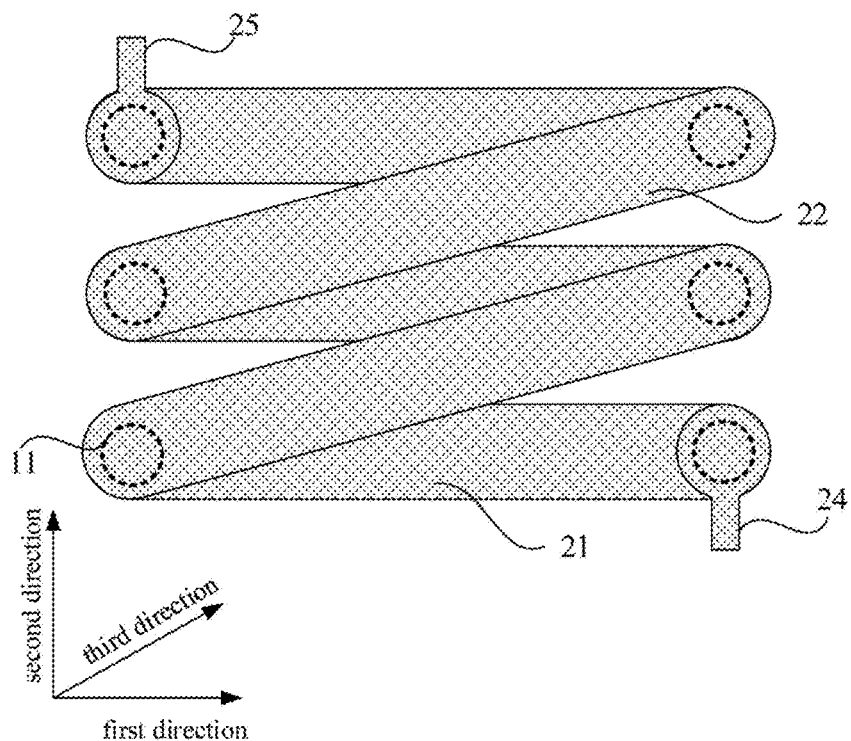
FIG. 36 is a top view of an inductor in an embodiment of the present disclosure.

In some implementations, FIG. 35 is a schematic diagram of a functional substrate according to an embodiment of the present disclosure; as shown in FIG. 35, the functional substrate is integrated with a capacitor, an inductor, and other structures, that is, the functional substrate is a substrate with a filtering function. FIG. 36 is a top view of an inductor according to an embodiment of the present disclosure, and referring to FIGS. 35 and 36, each of first sub-structures 21 of the inductor extends along a first direction, and the first sub-structures 21 are arranged side by side along a second direction; each of second sub-structures 22 of the inductor extends in a third direction, and the second sub-structures 22 are arranged side by side in the second direction. The first direction, the second direction and the third direction are different directions. In the embodiment of the present disclosure, the first direction and the second direction are perpendicular to each other, and the first direction and the third direction are intersected and non-perpendicular to each other. Certainly, a direction in which each first sub-structure 21 extends and a direction in which each second sub-structure 22 extends may be interchanged, which are all within the protective scope of the embodiments of the present disclosure. In addition, in the present embodiment, a case where the inductor includes N first sub-structures 21 and (N−1) second sub-structures 22 is taken as an example for illustration, where N≥2, and N is an integer. Orthographic projections of a first end and a second end of the first sub-structure 21 on the first dielectric substrate each at least partially overlap with an orthographic projection of one of first connection holes 11 on the first dielectric substrate. The first end and the second end of each first sub-structure 21 correspond to different first connection holes 11, i.e., an orthographic projection of one of the first sub-structures 21 on the first dielectric substrate is at least partially overlapped with orthographic projections of two first connection holes 11 on the first dielectric substrate. In such case, the first end of the $i^{th}$ second sub-structure 22 of the inductor is connected with the first end of the $i^{th}$ first sub-structure 21 and the second end of the $(i+1)^{th}$ first sub-structure 21 to form an inductor coil, where i is greater than or equal to 1 and less than or equal to (N−1), and i is an integer.

It should be noted that, a first lead terminal 24 is connected with the second end of a first sub-structure 21 of the inductor, and a second lead terminal 25 is connected with the first end of the $n^{th}$ first sub-structure 21. Further, the first lead terminal 24 and the second lead terminal 25 and the second sub-structure 22 may be disposed in a same layer and made of a same material, and in such case, the first lead terminal 24 may be connected with the second end of the first sub-structure 21 through one of first connection holes 11, and correspondingly, the second lead terminal 25 may be connected with the first end of the $n^{th}$ first sub-structure 21 through one of the first connection holes 11.

Figure 37:
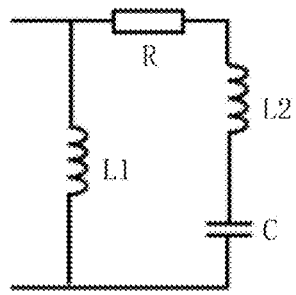
FIG. 37 is a schematic diagram of a filter circuit in an embodiment of the present disclosure.

FIG. 37 a schematic diagram of a filter circuit; as shown in FIG. 37, the filter circuit includes two inductors, a capacitor, and a resistor. For convenience of understanding, the two inductors are referred to as a first inductor L1 and a second inductor L2, respectively. With continued reference to FIG. 2, the first lead terminal of the first inductor L1 is connected with a first end of the resistor R, the second lead terminal of the first inductor is connected with a second plate of the capacitor C, the first lead terminal of the second inductor L2 is connected with a second end of the resistor R, and the second lead terminal of the second inductor L2 is connected with a first plate of the capacitor C.

It should be noted that the resistor R may be implemented by a wire, or a high-resistance material, such as tin oxide (ITO) or nickel chromium (NiCr) alloy, may be used for the resistor R. In the embodiment of the present disclosure, the formation of the resistor R is not limited, and the following description mainly describes the capacitor and inductor.

Further, in a case where the capacitor and the inductor of the functional substrate form a filter circuit, the first plate of the capacitor and the first sub-structures of the inductor may be disposed in a same layer. A first interlayer dielectric layer 4 is provided on a side of the first plate 31 of the capacitor away from first dielectric substrate, and the second plate 32 of the capacitor is provided on a side of the first interlayer dielectric layer 4 away from the first plate 31 of the capacitor; a second interlayer dielectric layer 5 is arranged on a side of the second plate 32 of the capacitor away from the first plate 31 of the capacitor, a second connection electrode 61 and a third connection electrode 62 are arranged on a side of the second interlayer dielectric layer 5 away from the first plate of the capacitor, and the second connection electrode 61 is connected with the first sub-structure 21 of the first inductor through a second connection hole penetrating through the first interlayer dielectric layer 4 and the second interlayer dielectric layer 5; the third connection electrode 62 is connected to the second plate 32 of the capacitor through a third connection hole penetrating through the second interlayer dielectric layer 5. A first protective layer 7 and a first planarization layer 101 are sequentially arranged on a side of the second connection electrode 61 and the third connection electrode 62 away from the first dielectric substrate 10; and a fourth connection hole 91 and a fifth connection hole 101 penetrating through the first protective layer 7 and the first planarization layer are formed. A first connection pad 102 and a second connection pad 103 are formed at the fourth connection hole and the fifth connection hole, respectively. The first connection pad 102 and the second connection pad 103 may be solder.

With continued reference to FIG. 34, a third protective layer and a third planarization layer may be formed on a side of the second sub-structures 22 away from the first dielectric substrate 10 to protect the second sub-structure 22 from moisture and oxygen eroding.

In some implementations, the first connection electrode 25 in the first connection hole 11 covers only an inner wall of the first connection hole 11, rather than filling up the first connection hole 11.

Further, in a case where the first connection electrode 25 covers only the inner wall of the first connection hole 11, a first receiving space is defined within the first connection hole, and in such case, a resin material may be filled in the first receiving space as a filling structure, thereby preventing the first connection electrode 25 from being oxidized and simultaneously playing a role of supporting to a certain extent.

Figure 38:
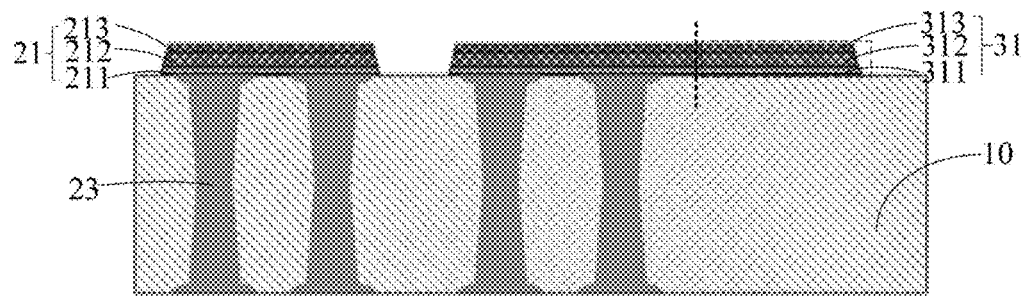
FIG. 38 is a schematic diagram of an intermediate product formed in a step S51 of a method for manufacturing the functional substrate shown in FIG. 34.
Figure 39:
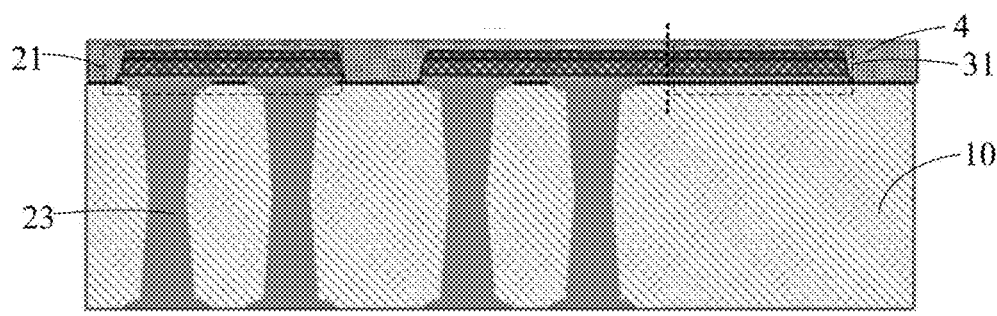
FIG. 39 is a schematic diagram of an intermediate product formed in a step S52 of the method for manufacturing the functional substrate shown in FIG. 34.
Figure 40:
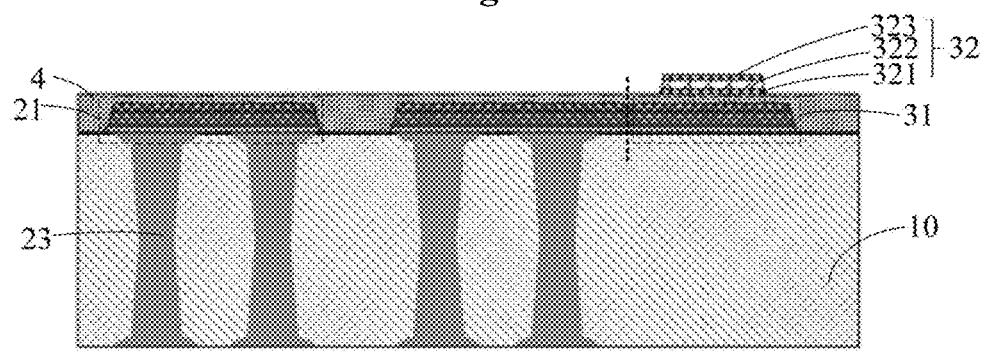
FIG. 40 is a schematic diagram of an intermediate product formed in a step S53 of the method for manufacturing the functional substrate shown in FIG. 34.
Figure 41:
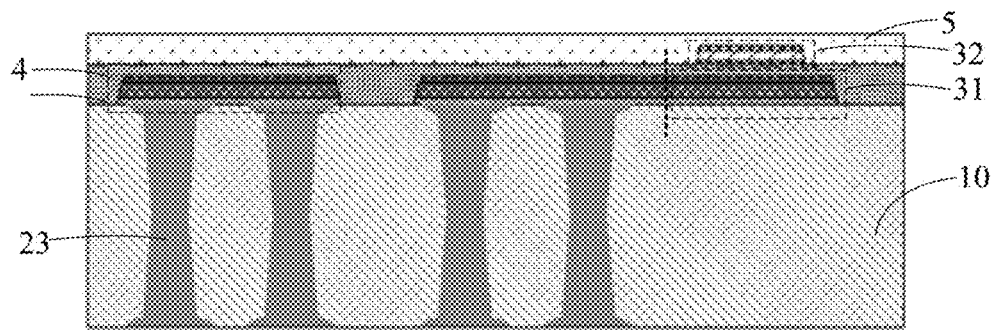
FIG. 41 is a schematic diagram of an intermediate product formed in a step S54 of the method for manufacturing the functional substrate shown in FIG. 34.
Figure 42:
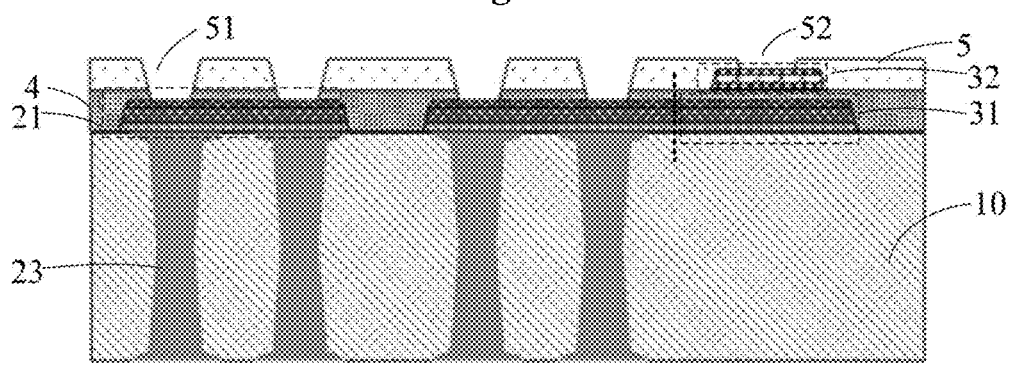
FIG. 42 is a schematic diagram of an intermediate product formed in a step S55 of the method for manufacturing the functional substrate shown in FIG. 34.
Figure 43:
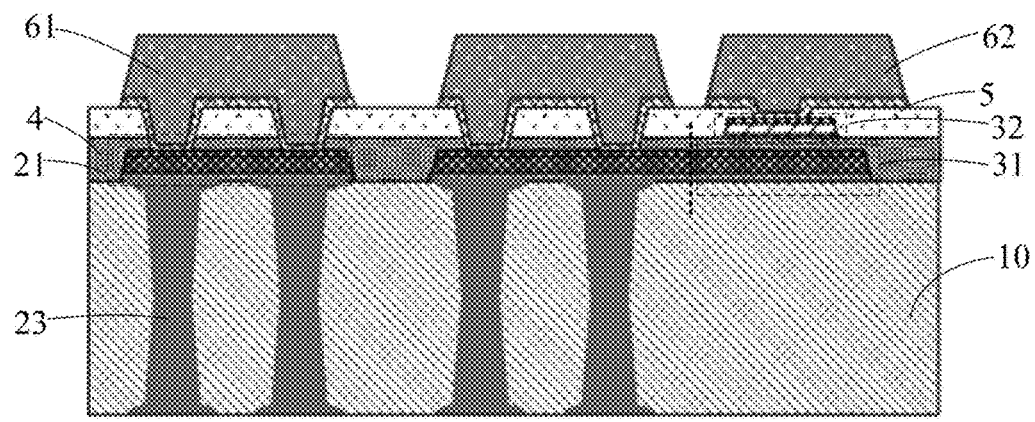
FIG. 43 is a schematic diagram of an intermediate product formed in a step S56 of the method for manufacturing the functional substrate shown in FIG. 34.
Figure 44:
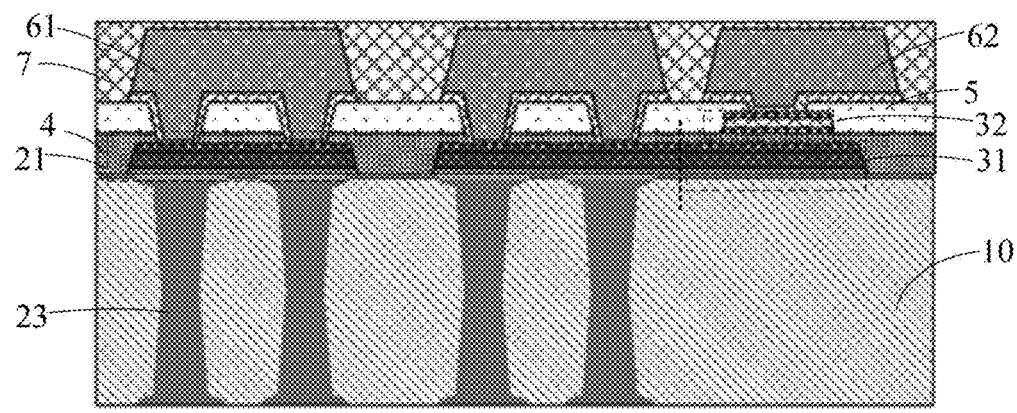
FIG. 44 is a schematic diagram of an intermediate product formed in a step S57 of the method for manufacturing the functional substrate shown in FIG. 34.
Figure 45:
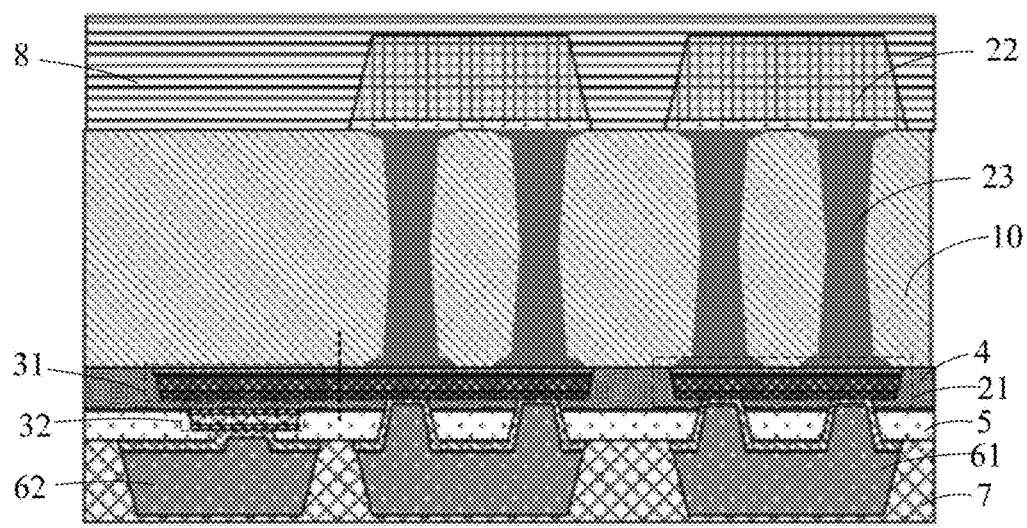
FIG. 45 is a schematic diagram of an intermediate product formed in a step S58 of the method for manufacturing the functional substrate shown in FIG. 34.
Figure 46:
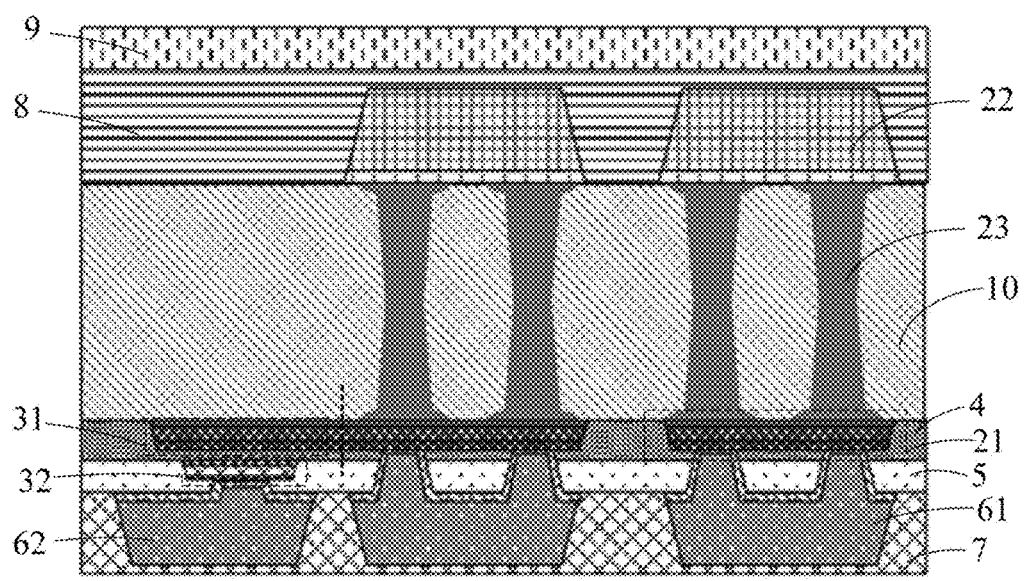
FIG. 46 is a schematic diagram of an intermediate product formed in a step S59 of the method for manufacturing the functional substrate shown in FIG. 34.
Figure 47:
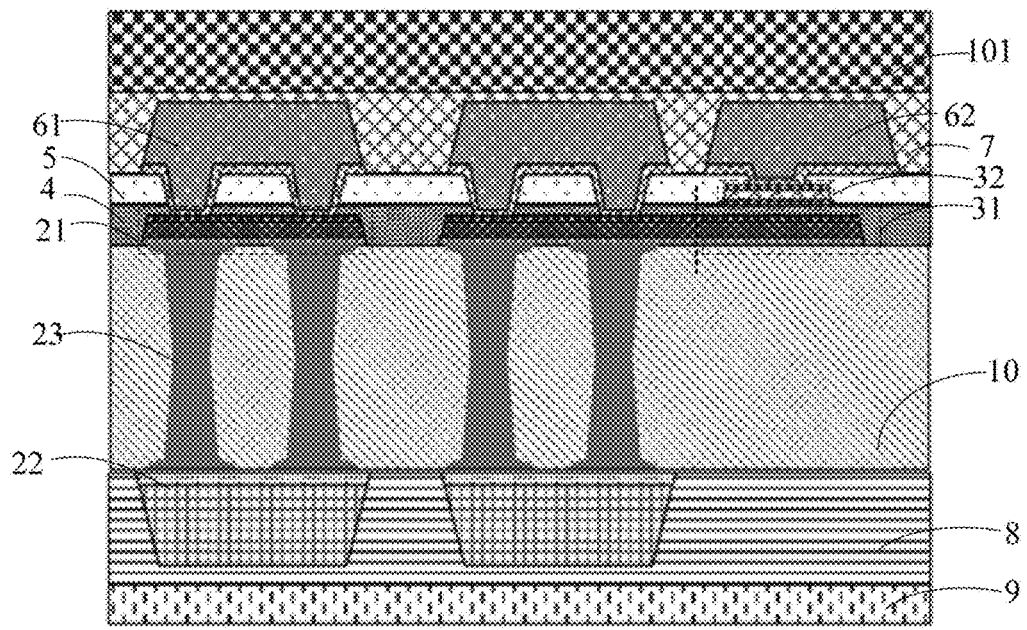
FIG. 47 is a schematic diagram of an intermediate product formed in a step S510 of the method for manufacturing the functional substrate shown in FIG. 34.
Figure 48:
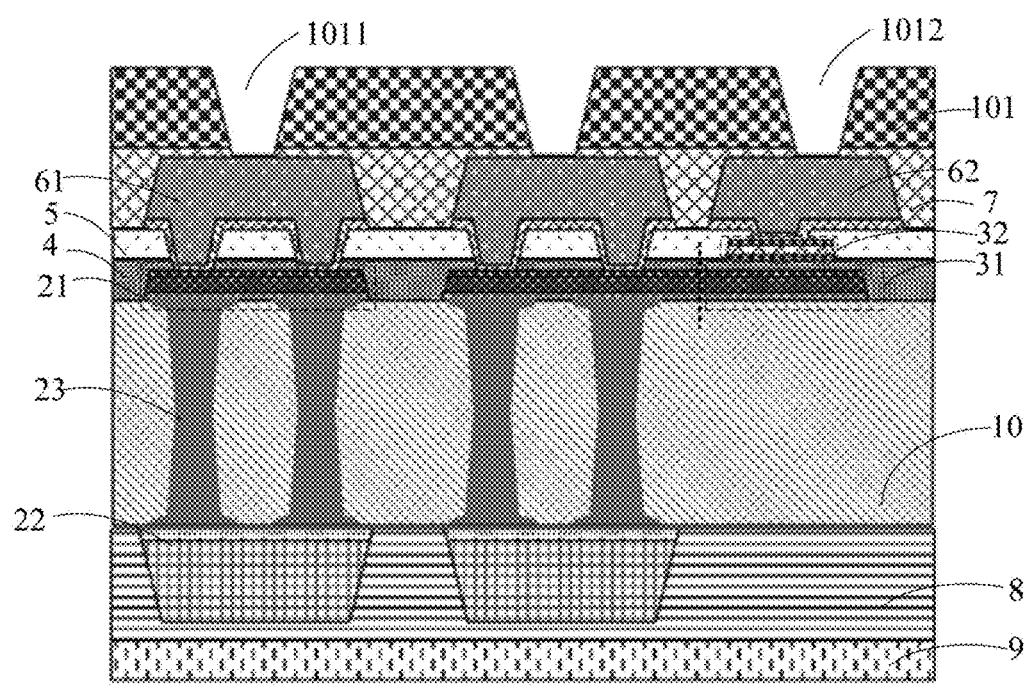
FIG. 48 is a schematic diagram of an intermediate product formed in a step S511 of the method for manufacturing the functional substrate shown in FIG. 34.

In order to make the structure of the functional substrate of the embodiment of the present disclosure clearer, a method for manufacturing the functional substrate in which the first connection hole with the structure of double nail heads is formed on the first dielectric substrate, and the inductor and the capacitor are formed after the first connection electrode is formed in the first connection hole is described below. FIG. 38 is a schematic diagram of an intermediate product formed in a step S51 of a method for manufacturing the functional substrate shown in FIG. 34; FIG. 39 is a schematic diagram of an intermediate product formed in a step S52 of the method for manufacturing the functional substrate shown in FIG. 34; FIG. 40 is a schematic diagram of an intermediate product formed in a step S53 of the method for manufacturing the functional substrate shown in FIG. 34; FIG. 41 is a schematic diagram of an intermediate product formed in a step S54 of the method for manufacturing the functional substrate shown in FIG. 34; FIG. 42 is a schematic diagram of an intermediate product formed in a step S55 of the method for manufacturing the functional substrate shown in FIG. 34; FIG. 43 is a schematic diagram of an intermediate product formed in a step S56 of the method for manufacturing the functional substrate shown in FIG. 34; FIG. 44 is a schematic diagram of an intermediate product formed in a step S57 of the method for manufacturing the functional substrate shown in FIG. 34; FIG. 45 is a schematic diagram of an intermediate product formed in a step S58 of the method for manufacturing the functional substrate shown in FIG. 34; FIG. 46 is a schematic diagram of an intermediate product formed in a step S59 of the method for manufacturing the functional substrate shown in FIG. 34; FIG. 47 is a schematic diagram of an intermediate product formed in a step S510 of the method for manufacturing the functional substrate shown in FIG. 34; FIG. 48 is a schematic diagram of an intermediate product formed in a step S511 of the method for manufacturing the functional substrate shown in FIG. 34. As shown in FIGS. 38 to 48, the method for manufacturing the functional substrate according to the embodiment of the present disclosure includes the following steps S51 to S511.

At the step S51, forming a first sub-structure 21 of an inductor and a first plate 31 of a capacitor on the first surface of the first dielectric substrate 10.

In some implementations, the first sub-structure 21 includes a first portion 211, a second portion 212, and a third portion 213 sequentially stacked and disposed on the first surface of the first dielectric substrate 10, and the first plate 31 of the capacitor includes a fourth portion 311, a fifth portion 312, and a sixth portion 313 sequentially stacked and disposed on the first surface of the first dielectric substrate 10, the first portion 211 and the fourth portion 311 are disposed in a same layer and are made of a same material; the second portion 212 and the fifth portion 312 are disposed in a same layer and are made of a same material; and the third portion 213 and the sixth portion 313 are disposed in a same layer and are made of a same material. The step S51 may specifically include the following steps S511 and S512.

At the step S511, sequentially depositing a first film layer, a second film layer and a third film layer on the first surface of the first dielectric substrate 10 by using, but not limited to, a magnetron sputtering method. The first film layer may be a molybdenum (Mo)-nickel (Ni) alloy layer, and has a thickness ranging from about 0.03 μm to about 0.05 μm; the second film layer may be a copper (Cu) layer with a thickness ranging from about 0.3 μm to about 0.5 μm; the third film layer may be a Mo—Ni alloy layer, and has a thickness ranging from about 0.02 μm to about 0.05 μm.

At the step S512, patterning the first film layer, the second film layer and the third film layer by a subtractive process to form the first sub-structure 21, including the first portion 211, the second portion 212 and the third portion 213 which are stacked, of the inductor, and the first plate 31, including the fourth portion 311, the fifth portion 312 and the sixth portion 313 which are stacked, of the capacitor. For example, a photoresist is spin-coated on a surface of the third film layer away from the first dielectric substrate 10, and exposed by using a corresponding mask plate, the photoresist is irradiated by ultraviolet light so as to be modified, the modified photoresist is developed and removed, then copper in a region which is not protected by the photoresist is etched off by using an etching solution for copper to form the first sub-structure 21, including the first portion 211, the second portion 212 and the third portion 213 which are stacked, of the inductor, and the first plate 31, including the fourth portion 311, the fifth portion 312 and the sixth portion 313 which are stacked, of the capacitor.

It should be noted that the layer where the first sub-structure 21 of the inductor and the first plate 31 of the capacitor are located is very critical in the whole device, the layer, on one hand, serves as the plate of the capacitor, and has a high expectation on flatness, and if the layer is formed as a relatively thick copper layer by electroplating, it is desired to be planarized by a chemical mechanical method; on the other hand, the layer serves as connection structures between TGV holes (the first connection holes 11) and between the inductor and the capacitor. In order to ensure the reliability of conduction of the first sub-structure 21 with the first connection electrode 25 subsequent formed in the first connection hole at a connection point where the first sub-structure 21 is connected with the first connection electrode 25, an edge of the first sub-structure 21 extends 5 μm to 10 μm beyond an edge of the first connection electrode 25 in the first connection hole 11.

At the step S52, forming a first interlayer dielectric layer 4 on a side of the first sub-structure 21 of the inductor and the first plate 31 of the capacitor away from the first dielectric substrate 10.

In some implementations, the step S52 may specifically include: depositing the first interlayer dielectric layer 4 on the side of the first sub-structure 21 of the inductor and the first plate 31 of the capacitor away from the first dielectric substrate 10 by a standard process such as Plasma Enhanced Chemical Vapor Deposition (PECVD).

A material of the first interlayer dielectric layer 4 is an inorganic insulating material. For example, the first interlayer dielectric layer 4 is an inorganic insulating layer formed of silicon nitride (SiNx), or an inorganic insulating layer formed of silicon oxide (SiO$_2$), or any composite film layer formed by staking the inorganic insulating layer made of SiNx and the inorganic insulating layer made of SiO$_2$. Certainly, the first interlayer dielectric layer 4 also serves as an interlayer dielectric layer of the capacitor. A thickness of the first interlayer dielectric layer 4 is about 120 nm.

At the step S53, forming a pattern including a second plate 32 of the capacitor on a side of the first interlayer dielectric layer 4 away from the first dielectric substrate 10.

In some implementations, the step S53 may include: depositing a fourth film layer, a fifth film layer, and a sixth film layer in sequence by using a method including but not limited to magnetron sputtering, spin-coating a photoresist on a surface of the sixth film layer away from the first dielectric substrate 10, exposing the photoresist with a corresponding mask plate, modifying the photoresist by irradiating ultraviolet light thereon, developing and removing the modified photoresist, and etching off copper in a region not protected by the photoresist with an etching solution for copper to form the second plate 32 including a seventh portion 321, a eighth portion 322, and an ninth portion 323 which are stacked, of the capacitor.

The fourth film layer may be a molybdenum (Mo)-nickel (Ni) alloy layer, and has a thickness ranging from about 0.03 μm to 0.05 μm; the fifth film layer may be a copper (Cu) layer with a thickness ranging from about 0.3 μm to 0.5 μm; and the sixth film layer may be a Mo—Ni alloy layer, and has a thickness ranging from about 0.02 μm to 0.05 μm.

At the step S54, forming a second interlayer dielectric layer 5.

In some implementations, the step S54 includes: depositing the second interlayer dielectric layer 5 on a side of the second plate 32 of the capacitor away from the first dielectric substrate 10 by using a standard process such as PECVD.

A material of the second interlayer dielectric layer 5 may be the same as that of the first interlayer dielectric layer 4, and a thickness of the second interlayer dielectric layer may range from 0.2 μm to 0.5 μm.

At the step S55, forming a second connection hole penetrating through the first interlayer dielectric layer 4 and the second interlayer dielectric layer 5 and a third connection hole penetrating through the second interlayer dielectric layer 5.

In some implementations, the step S55 includes: forming the second connection hole penetrating through the first interlayer dielectric layer 4 and the second interlayer dielectric layer 5, and the third connection hole penetrating through the second interlayer dielectric layer 5 by dry etching.

At the step S56, forming a second connection electrode 61 and a third connection electrode 62, the second connection electrode 61 being connected with the lead terminal of the inductor through the second connection hole, and the third connection electrode 62 being electrically connected with the second plate 32 of the capacitor through the third connection hole.

In some implementations, the step S56 may include: sequentially forming a seventh film layer 60 and an eighth film layer on a side of the second interlayer dielectric layer 5 away from the first dielectric substrate 10 by using a method including but not limited to magnetron sputtering, electroplating the eighth film layer serving as a third film layer, and then patterning the eighth film layer, which is thickened by electroplating, and the seventh film layer 60 to form the second connection electrode 61 and the third connection electrode 62.

The seventh film layer may be a molybdenum (Mo)-nickel (Ni) alloy layer, and has a thickness ranging from about 0.03 μm to 0.05 μm, and the eighth film layer may be a copper (Cu) layer with a thickness ranging from about 0.3 μm to 0.5 μm. The seventh film layer 60 is provided to increase the adhesion force of the eighth film layer.

At the step S57, forming the first protective layer 7.

In some implementations, the step S57 includes: forming the first protective layer 7 by deposition using a standard process such as PECVD.

The first protective layer 7 is used for preventing moisture and oxygen from corroding the devices formed on the first surface of the first dielectric substrate 10. A thickness of the first protective layer 7 ranges from 0.4 μm to 0.6 μm, and the first protective layer 7 may be made of an inorganic insulating material. For example, the first protective layer 7 may be an inorganic insulating layer formed of silicon nitride (SiNx), or an inorganic insulating layer formed of silicon oxide (SiO$_2$), or any composite film layer formed by staking the inorganic insulating layer made of SiNx and the inorganic insulating layer made of SiO$_2$.

At the step S58, turning the first dielectric substrate 10 over, forming second sub-structures 22 of the inductor on the second surface of the first dielectric substrate 10, and forming a second protective layer 8 on a side of the second sub-structures 22 away from the first dielectric substrate 10.

In some implementations, the step S58 includes: forming a second conductive film layer, as a second seed layer, on the second surface of the first dielectric substrate 10 formed with the first connection electrode 25 by using a method including but not limited to magnetron sputtering; electroplating the second seed layer, a thickness of the electroplated second seed layer being generally greater than 5 μm; and then patterning the electroplated second seed layer to form the second sub-structures 22 of the inductor; and forming the second protective layer 8 by deposition by adopting a standard process such as PECVD.

The second protective layer 8 is used for preventing moisture and oxygen from corroding the devices formed on the second surface of the first dielectric substrate 10. A thickness of the second protective layer 8 ranges from 0.4 μm to 0.6 μm, and the second protective layer 8 may be made of an inorganic insulating material. For example, the second protective layer 8 may be an inorganic insulating layer formed of silicon nitride (SiNx), or an inorganic insulating layer formed of silicon oxide (SiO$_2$), or any composite film layer formed by staking the inorganic insulating layer made of SiNx and the inorganic insulating layer made of SiO$_2$.

At the step S59, forming a second planarization layer 9 on a side, away from the first dielectric substrate 10, of the second protective layer 8.

In some implementations, the second planarization layer 9 may be formed by using a standard process such as PECVD.

A thickness of the second planarization layer 9 is 2 μm or more; a material of the second planarization layer 9 may include an organic insulating material including, for example, resin-based materials such as polyimide, epoxy, acryl, polyester, photoresist, polyacrylate, polyamide, siloxane. As another example, the organic insulating material includes an elastic material, such as urethan, Thermoplastic Polyurethane (TPU), or the like.

At the step S510, turning the first dielectric substrate 10 over, and forming a first planarization layer 101 on a side of the first protective layer 7 away from the first dielectric substrate 10.

A thickness of the first planarization layer 101 is 2 μm or more; a material of the first planarization layer 101 may include an organic insulating material including, for example, resin-based materials such as polyimide, epoxy, acryl, polyester, photoresist, polyacrylate, polyamide, siloxane. As another example, the organic insulating material includes an elastic material, such as urethan, Thermoplastic Polyurethane (TPU), or the like.

At the step S511, etching the first protective layer and the second protective layer to form a fourth connection hole and a fifth connection hole.

At the step S512, forming a first connection pad 102 and a second connection pad 103, the first connection pad 102 and the second connection pad 103 being respectively formed at positions corresponding to the fourth connection hole and the fifth connection hole, as shown in FIG. 34.

The first connection pad 102 and the second connection pad 103 may be solder.

So far, the manufacturing of the filter is completed.

It should be noted that, in the embodiment of the present disclosure, a capacitance value of the capacitor is determined by the thickness of the first interlayer dielectric layer 4, a dielectric constant of the material of the first interlayer dielectric layer 4, and an area of the first plate 31 and the second plate 32 of the capacitor facing each other. An inductance value of the inductor is determined by the number of turns (coils) of solenoid, a pitch between spirals (coils) of the solenoid and a diameter of the spiral (coil). Therefore, the dielectric constant of the material of the first interlayer dielectric layer 4 of the capacitor, parameters of the first plate 31 and the second plate 32 of the capacitor, parameters such as sizes of the first sub-structure 21 and the second sub-structure 22 of the inductor and a pitch therebetween can be reasonably designed, so that the effect of optimizing the filter circuit can be achieved.

In a second aspect, an embodiment of the present disclosure provides an electronic device, which includes the functional substrate described above.

It will be understood that the above embodiments are merely exemplary embodiments adopted to illustrate the principles of the present disclosure, and the present disclosure is not limited thereto. It will be apparent to those skilled in the art that various modifications and improvements can be made without departing away from the spirit and scope of the present disclosure, and such modifications and improvements are also considered to be within the scope of the present disclosure.

What is claimed is:

1. A functional substrate, comprising: a first dielectric substrate, wherein the first dielectric substrate comprises a first surface and a second surface which are oppositely arranged along a thickness direction of the first dielectric substrate; the first dielectric substrate is provided with a first connection hole; the first connection hole at least penetrates through the first surface; a first connection electrode is arranged in the first connection hole;

the first connection hole comprises a first sub-hole and a second sub-hole which are sequentially arranged along a direction away from the second surface and are communicated with each other; the second sub-hole penetrates through the first surface;

an opening width of the second sub-hole is monotonically increased in the direction away from the second surface, and a minimum opening width of the second sub-hole is not smaller than a maximum opening width of the first sub-hole; the first sub-hole and the second sub-hole form a corner at a position where the first sub-hole and the second sub-hole are connected with each other, the functional substrate further comprises a first conductive layer located on the first surface and connected with the first connection electrode;

the first connection hole penetrates through the second surface, and the functional substrate further comprises a second conductive layer located on the second surface, and the second conductive layer is connected with the first connection electrode;

the functional substrate further comprises an inductor integrated on the first dielectric substrate, the inductor comprises a first sub-structure, a second sub-structure, and a plurality of the first connection electrodes, wherein the first sub-structure is located on the first surface, the second sub-structure is located on the second surface, and the first sub-structure is connected with the second sub-structure through the first connection electrode to form a coil structure of the inductor; and wherein the functional substrate further comprises: a first plate of a capacitor located in the first conductive layer; a first interlayer dielectric layer located on a side of the first conductive layer away from the first dielectric substrate; and a second plate of the capacitor located on a side of the first interlayer dielectric layer away from the first conductive layer.

2. The functional substrate of claim 1, wherein the first connection hole penetrates through the first surface and the second surface, the first connection hole further comprises a third sub-hole communicating with the first sub-hole and penetrating through the second surface; an opening width of the third sub-hole is monotonically decreased in the direction away from the second surface, and a minimum opening width of the third sub-hole is not smaller than the maximum opening width of the first sub-hole; and the first sub-hole and the third sub-hole form a corner at a position where the first sub-hole and the third sub-hole are connected with each other.

3. The functional substrate of claim 1, wherein the first sub-hole penetrates through the second surface.

4. The functional substrate of claim 1, wherein the first sub-hole has an hourglass shape.

5. The functional substrate of claim 1, wherein an opening width of the first sub-hole is monotonically increased in the direction away from the second surface.

6. The functional substrate of claim 1, wherein the first connection electrode fills the first connection hole or covers only an inner wall of the first connection hole.

7. The functional substrate of claim 1, further comprising a second interlayer dielectric layer, a second connection electrode, and a third connection electrode located on a side of the second plate of the capacitor away from the first dielectric substrate;

the second connection electrode is connected with a lead end of the inductor through a second connection hole penetrating through the first interlayer dielectric layer and the second interlayer dielectric layer; the third connection electrode is electrically connected with the second plate of the capacitor through a third connection hole penetrating through the second interlayer dielectric layer.

8. The functional substrate of claim 1, further comprising a first protective layer and a first planarization layer sequentially located on a side of a layer, in which the second connection electrode and the third connection electrode are located, away from the first dielectric substrate, and a first connection pad and a second connection pad;

the first connection pad is connected with the second connection electrode through a fourth connection hole, and the second connection pad is connected with the third connection electrode through a fifth connection hole; both the fourth connection hole and the fifth connection hole penetrate through the first protective layer and the first planarization layer.

9. The functional substrate of claim 1, further comprising a second protective layer and a second planarization layer sequentially located on a side of the second conductive layer away from the first dielectric substrate.

10. The functional substrate of claim 1, wherein the first connection hole penetrates through the second surface;

the functional substrate further comprises:
a first conductive layer located on the first surface and a second conductive layer located on the second surface, the first conductive layer and the second conductive layer being connected through the first connection hole; a first buffer layer located between the first conductive layer and the first surface; and a second buffer layer located between the second conductive layer and the second surface.

11. An electronic device, comprising the functional substrate of claim 1.

12. A method for manufacturing a functional substrate, comprising:

providing a first dielectric substrate, the first dielectric substrate comprising a first surface and a second surface which are oppositely arranged along a thickness direction of the first dielectric substrate;

forming a first connection hole in the first dielectric substrate, wherein the first connection hole at least penetrates through the first surface; the first connection hole comprises a first sub-hole and a second sub-hole which are sequentially arranged along a direction away from the second surface and are communicated with each other; the second sub-hole penetrates through the first surface; an opening width of the second sub-hole is monotonically increased in the direction away from the second surface, and a minimum opening width of the second sub-hole is not smaller than a maximum opening width of the first sub-hole; the first sub-hole and the second sub-hole form a corner at a position where the first sub-hole and the second sub-hole are connected with each other; and forming a first connection electrode located in the first connection hole, wherein the method further comprises: forming a first conductive layer on the first surface, wherein the first conductive layer is connected with the first connection electrode: forming a second conductive layer on the second surface, wherein the second conductive layer is connected with the first connection electrode; and forming an inductor on the first dielectric substrate, wherein the inductor comprises a first sub-structure, a second sub-structure and a plurality of the first connection electrodes, the first sub-structure is located on the first surface, the second sub-structure is located on the second surface, and the first sub-structure is connected with the second sub-structure through the first connection electrode to form a coil structure of the inductor, and wherein the method further comprises: forming a first plate of a capacitor located in the first conductive layer; forming a first interlayer dielectric layer located on a side of the first conductive layer away from the first dielectric substrate, and forming a second plate of the capacitor located on a side of the first interlayer dielectric layer away from the first conductive layer.

13. The method of claim 12, wherein the forming the first connection hole comprises:

providing the first dielectric substrate, and forming a photoresist layer on the first surface of the first dielectric substrate;

exposing, developing and etching the photoresist layer to form a fully exposed region corresponding to the first connection hole and an unexposed region; and irradiating, by a laser, a position of the first dielectric substrate corresponding to the fully exposed region, and removing a material of the first dielectric substrate at the position corresponding to the fully exposed region to form the first connection hole.

14. The method of claim 12, wherein the forming the first connection hole comprises:
providing the first dielectric substrate, forming a first photoresist layer on the first surface of the first dielectric substrate, and forming a second photoresist layer on the second surface; exposing, developing and etching the first photoresist layer to form a first fully exposed region corresponding to the first connection hole and a first unexposed region; exposing, developing and etching the second photoresist layer to form a second fully exposed region corresponding to the first connection hole and a second unexposed region;
respectively irradiating, by a laser, positions of the first dielectric substrate corresponding to the first fully exposed region and the second fully exposed region, and removing a material of the first dielectric substrate at the positions corresponding to the first fully exposed region and the second fully exposed region to form the first connection hole, wherein the first connection hole penetrates through the second surface.

15. The method of claim 13, wherein the first connection hole penetrates through the second surface.

* * * * *